US009916897B2

United States Patent
Nam et al.

(10) Patent No.: US 9,916,897 B2
(45) Date of Patent: Mar. 13, 2018

(54) STORAGE DEVICE

(71) Applicant: SAMSUNG ELECTRONICS CO., LTD., Suwon-si, Gyeonggi-Do (KR)

(72) Inventors: Hee Hyun Nam, Seoul (KR); Youngjin Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 118 days.

(21) Appl. No.: 15/055,779

(22) Filed: Feb. 29, 2016

(65) Prior Publication Data

US 2016/0364153 A1   Dec. 15, 2016

(30) Foreign Application Priority Data

Jun. 10, 2015   (KR) .................. 10-2015-0081805

(51) Int. Cl.
*G06F 3/06*   (2006.01)
*G11C 16/00*   (2006.01)
*G06F 11/00*   (2006.01)

(52) U.S. Cl.
CPC .............. *G11C 16/00* (2013.01); *G06F 11/00* (2013.01)

(58) Field of Classification Search
CPC .. H04W 52/0229; G06F 3/061; G06F 3/0688; G06F 3/0659; G06F 3/0679; G06F 3/0656; G06F 11/1008; G06F 11/1012; G06F 11/1044; G06F 11/00; G11C 16/00
See application file for complete search history.

(56) References Cited

U.S. PATENT DOCUMENTS

| | | |
|---|---|---|
| 5,054,069 A | 10/1991 | Maeno et al. |
| 5,237,593 A | 8/1993 | Fisher et al. |
| 5,357,249 A | 10/1994 | Azaren et al. |
| 5,999,570 A | 12/1999 | Chaki |
| 6,356,555 B1 | 3/2002 | Rakib et al. |
| 6,691,205 B2 | 2/2004 | Zilberman |
| 6,839,266 B1 | 1/2005 | Garrett, Jr. et al. |
| 7,403,409 B2 | 7/2008 | Dreps et al. |
| 7,581,041 B1 | 8/2009 | Whitby-Strevens et al. |
| 7,679,133 B2 | 3/2010 | Son et al. |
| 7,839,308 B2 | 11/2010 | Kim et al. |
| 7,929,549 B1 | 4/2011 | Talbot |
| 8,341,727 B2 | 12/2012 | Worley, Jr. et al. |
| 8,452,912 B2 | 5/2013 | Lee et al. |
| 8,553,466 B2 | 10/2013 | Han et al. |
| 8,559,235 B2 | 10/2013 | Yoon et al. |
| 8,595,428 B2 | 11/2013 | Bains et al. |
| 8,654,587 B2 | 2/2014 | Yoon et al. |
| 8,805,886 B1 * | 8/2014 | Kiselev ............ G06F 17/30377 707/793 |
| 8,971,907 B2 | 3/2015 | Frenne et al. |
| 2006/0023874 A1 | 2/2006 | Gilliland |

(Continued)

*Primary Examiner* — Hashem Farrokh
(74) *Attorney, Agent, or Firm* — Volentine & Whitt, PLLC

(57) ABSTRACT

A storage device includes nonvolatile memories and a device controller configured to store data being received from an external device in an internal RAM, according to a command and an address being received from the external device. The device controller controls the nonvolatile memories according to the data stored in the internal RAM, distinguishes whether phase bits received with the data and also stored in the internal RAM are valid, and processes the data stored in the internal RAM when the phase bits are valid.

20 Claims, 19 Drawing Sheets

(56) References Cited

U.S. PATENT DOCUMENTS

| | | |
|---|---|---|
| 2007/0162964 A1 | 7/2007 | Wang et al. |
| 2011/0041005 A1 | 2/2011 | Selinger |
| 2011/0233648 A1 | 9/2011 | Seol et al. |
| 2012/0102263 A1 | 4/2012 | Aswadhati |
| 2014/0223262 A1 | 8/2014 | Takefman et al. |
| 2014/0237157 A1 | 8/2014 | Takefman et al. |
| 2014/0237176 A1* | 8/2014 | Takefman ........... G06F 11/1008 711/105 |
| 2014/0365710 A1* | 12/2014 | Chen ................... G06F 12/0246 711/103 |

* cited by examiner

STORAGE DEVICE

CROSS-REFERENCE TO RELATED APPLICATIONS

This U.S. non-provisional patent application claims priority under 35 U.S.C. § 119 of Korean Patent Application No. 10-2015-0081805, filed on Jun. 10, 2015, the entire contents of which are hereby incorporated by reference.

BACKGROUND

The disclosure relates to a memory, and more particularly, to a storage device including a nonvolatile memory.

A computing device includes a processor, a main memory device and a storage device. As semiconductor technology develops, performance of a processor, a main memory device and a storage device is being improved. As performance of a processor, a main memory device and a storage device is improved, performance of a computing device may also be improved.

In general, a factor impeding an operation speed of a computing device is performance of a storage device. However, as nonvolatile memories such as a flash memory, a PRAM (phase-change random access memory), an RRAM (resistive RAM), an MRAM (magnetic RAM), an FeRAM (ferroelectric RAM), etc. are applied to the storage device, performance of the storage device is significantly being improved. Accordingly, a factor impeding an operation speed of a computing device moves from performance of the storage device to a communication speed between a processor and the storage device.

Thus, a new device and a new method for improving a communication speed between a processor and a storage device are being required. A new device and a new method for solving problems being found in the process of improving a communication speed between a processor and a storage device are also being required.

SUMMARY

Embodiments of the disclosure provide a storage device. The storage device includes nonvolatile memories and a device controller. The device controller is configured to store data being received from an external device in an internal random access memory (RAM), according to a command and an address being received from the external device, and to control the nonvolatile memories according to the data stored in the internal RAM. The device controller is also configured to distinguish whether phase bits received with the data and also stored in the internal RAM are valid and to process the data stored in the internal RAM when the phase bits are valid.

Embodiments of the disclosure also provide a storage device. The storage device includes nonvolatile memories and a device controller. The device controller is configured to store data being received from an external device in an internal RAM according to a command and an address being received from the external device and to control the nonvolatile memories according to the data stored in the internal RAM. The device controller is also configured to descramble phase bits received with the data and also stored in the internal RAM and to descramble the data stored in the internal RAM when the descrambled phase bits have a valid pattern.

Embodiments of the disclosure also provide an operating method of a storage device including nonvolatile memories and a device controller configured to control the nonvolatile memories. The operating method includes a step in which the device controller checks whether phase bits among data received from an external device are valid, a step in which if the phase bits are valid, the device controller descrambles the data received from the external device, and a step in which the device controller detects another command and another address from the descrambled data to transmit them to the nonvolatile memories.

Embodiments of the disclosure also provide a data storage device having a RAM and a device controller that stores a write unit received from a host in the RAM. The write unit includes validation information and encoded data bits. The device controller determines whether the validation information represents expected information, decodes the encoded data bits of the write unit when the validation information is determined to represent the expected information, and does not decode the encoded data bits when the validation information is determined not to represent the expected information.

BRIEF DESCRIPTION OF THE FIGURES

Preferred embodiments of the disclosure will be described below in more detail with reference to the accompanying drawings. The embodiments of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

DETAILED DESCRIPTION

Figure 1:
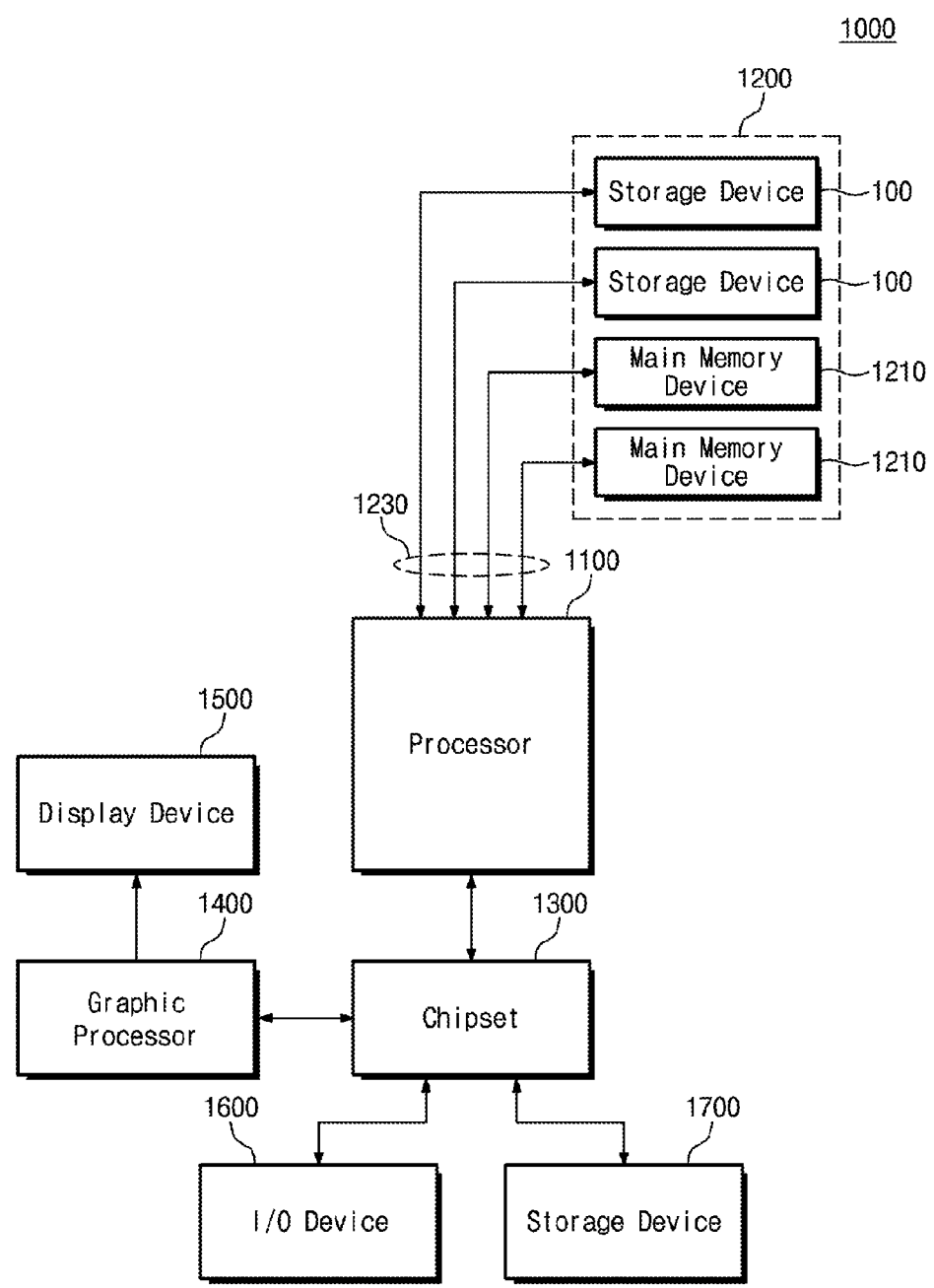
FIG. 1 is a block diagram illustrating a computing device in accordance with exemplary embodiments of the disclosure.

Embodiments of disclosure will be described more fully hereinafter with reference to the accompanying drawings, in which embodiments of the invention are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. In the drawings, the size and relative sizes of layers and regions may be exaggerated for clarity. Like numbers refer to like elements throughout.

FIG. 1 is a block diagram illustrating a computing device 1000 in accordance with exemplary embodiments of the disclosure. Referring to FIG. 1, the computing device 1000 includes a processor 1100, a high speed storage device 1200, a chipset 1300, a graphic processor 1400, a display device 1500, an I/O (input/output) device 1600, and a storage device 1700.

The processor 1100 can control an overall operation of the computing device 1000 and perform a logical operation. The processor 1100 can drive an operating system (OS) and applications. The processor 1100 may be a central processing unit (CPU) or an application processor (AP).

The high speed storage device 1200 is configured to communicate with the processor 1100 through a high speed interface 1230. The high speed storage device 1200 may include at least one main memory device 1210 and at least one storage device 100. The main memory device 1210 may be used as an operating memory of the processor 1100. The main memory device 1210 may include a DDR (double data rate) SDRAM (synchronous dynamic random access memory). The main memory device 1210 may be configured to operate based on an RDIMM (registered dual in-line memory module) or an LRDIMM (load reduced DIMM). The high speed interface 1230 may include a DIMM interface determined by a DIMM specification.

Like the main memory device 1210, the storage device 100 may be connected to the processor 1100 through the high speed interface 1230, for example, a DIMM interface. The storage device 100 may include nonvolatile memories such as a flash memory, a PRAM (phase-change random access memory), an RRAM (resistive RAM), an MRAM (magnetic RAM), an FeRAM (ferroelectric RAM), etc. The storage device 100 may be configured to operate based on a specification of an RDIMM (registered dual in-line memory module) or an LRDIMM (load reduced DIMM).

The chipset 1300 is configured to arbitrate a connection between the processor 1100 and other devices under the control of the processor 1100. For example, the chipset 1300 may include a south bridge. The chipset 1300 may also include various devices such as a sound processor, an ethernet adaptor, etc.

The graphic processor 1400 is configured to perform image processing and display an image through the display device 1500. The graphic processor 1400 may be a GPU (graphic processing unit). The graphic processor 1400 may be included inside the chipset 1300.

The display device 1500 is configured to display an image under the control of the graphic processor 1400. For example, the display device 1500 may include an LCD (liquid crystal display) device, an LED (light emitting diode) device, a beam projector, etc.

The I/O device 1600 may include an input device receiving a signal from a user of the computing device 1000 and an output device outputting a signal to a user of the computing device 1000. For example, the I/O device 1600 may include at least one input device such as a key board, a mouse, a microphone, a touch pad, a touch panel, a combination thereof, etc. and at least one output device such as a speaker, a lamp, a printer, a combination thereof, etc.

The storage device 1700 is configured to operate according to a control of the chipset 1300. The storage device 1700 can communicate with the chipset 1300 based on an interface such as a serial at attachment (SATA), a universal serial bus (USB), a universal flash storage (UFS), a peripheral component interconnection (PCI), a PCI express, a NVM-express, a small computer system interface (SCSI), and a serial attached SCSI (SAS).

A communication speed (e.g., a communication speed with the processor 1100) of the storage device 100 directly connected to the processor 1100 through the high speed interface 1230 is higher than a communication speed (a communication speed with the chipset 1300) of the storage device 1700 connected to the chipset 1300. Thus, if the storage device 100 connected to the processor 1100 through the high speed interface 1230 is provided, operating performance of the computing device 1000 is improved.

Figure 2:
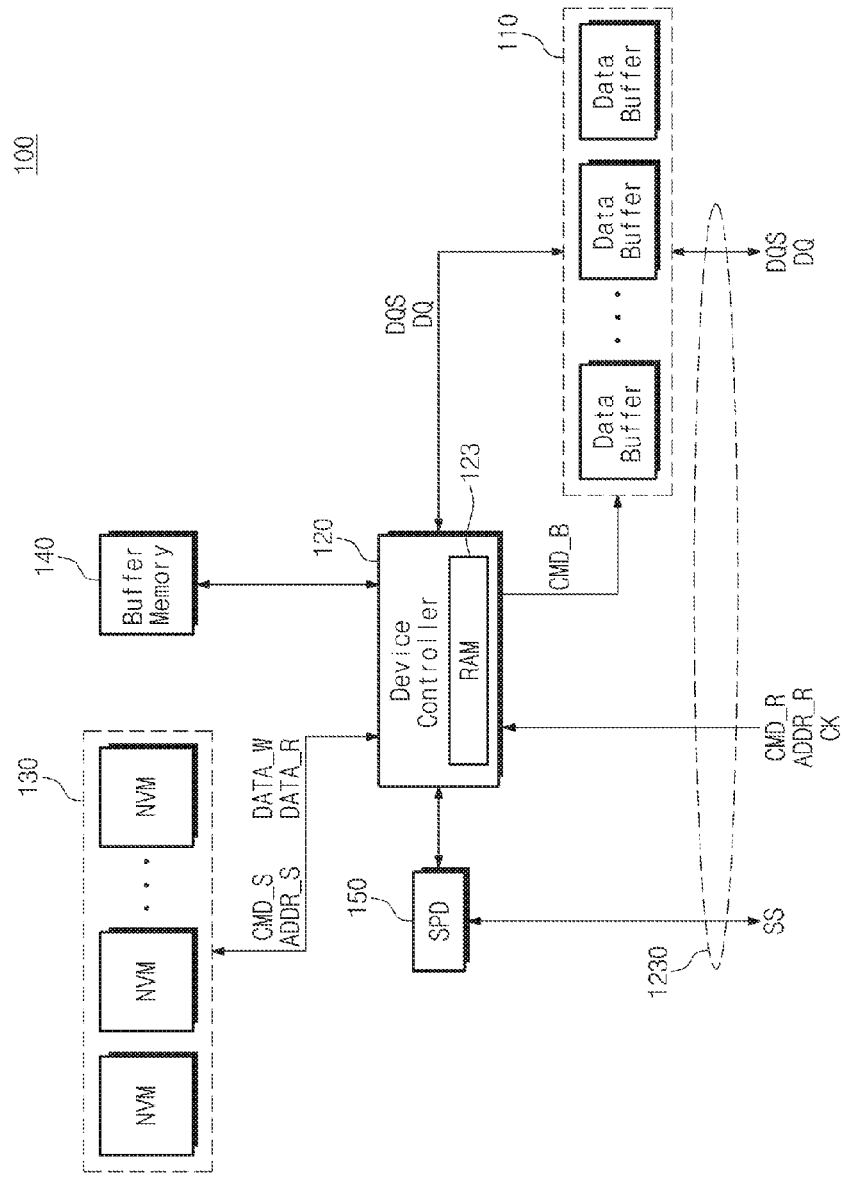
FIG. 2 is a block diagram illustrating a storage device in accordance with exemplary embodiments of the disclosure.

FIG. 2 is a block diagram illustrating a storage device 100 in accordance with exemplary embodiments of the disclosure. Referring to FIGS. 1 and 2, the storage device 100 includes data buffers 110, a device controller 120, nonvolatile memories 130 or NVM, a buffer memory 140, and an SPD (serial presence detect) 150.

The data buffers 110 can receive data signals DQ and data strobe signals DQS from the processor 1100 through the high speed interface 1230. The data buffers 110 can exchange the data signals DQ and the data strobe signals DQS with the device controller 120. The data buffers 110 may be configured according to the DDR4 LRDIMM specification. For example, nine data buffers 110 may be provided to the storage device 100. Each data buffer 110 can exchange eight data signals DQ and two data strobe signals DQS with an external device, for example, the processor 1100.

The device controller 120 receives the data signals DQ and the data strobe signals DQS from the data buffers 110. The device controller 120 can receive a RAM command CMD_R, a RAM address ADDR_R and a clock CK from the processor 1100 through the high speed interface 1230.

The RAM command CMD_R may be a command requesting access to a RAM 123 of the device controller 120. The RAM address ADDR_R may be an address that belongs to an address range of the RAM 123. The device controller 120 can write data being received as data signals DQ of the high speed interface 1230 in the RAM 123 in response to the RAM command CMD_R and the RAM address ADDR_R being received through the high speed interface 1230. The device controller 120 can output data stored in the RAM 123 as data signals DQ of the high speed interface 1230 in response to the RAM command CMD_R and the RAM address ADDR_R being received through the high speed interface 1230. That is, a physical layer of the processor 1100 may identify that the RAM 123 of the storage device 100 is connected to the high speed interface 1230. The physical layer of the processor 1100 can access the RAM 123 using the RAM command CMD_R and the RAM address ADDR_R.

The device controller 120 can detect a storage command CMD_S and a storage address ADDR_S with respect to the nonvolatile memories 130 from data stored in the RAM 123. The device controller 120 can write or store write data DATA_W among data stored in the RAM 123 in the nonvolatile memories 130 in response to the storage command CMD_S and the storage address ADDR_S. The device controller 120 can read data from the nonvolatile memories 130 and store the read data DATA_R in the RAM 123 in response to the storage command CMD_S and the storage address ADDR_S. That is, an upper layer of the physical layer of the processor 1100, for example, a device driver of the processor 1100 may identify that the nonvolatile memories 130 are connected to the high speed interface 1230 through the RAM 123. The device driver of the processor 1100 can exchange the storage command CMD_S, the storage address ADDR_S and data with respect to the nonvolatile memories 130 with the storage device 100 as the data signals DQ of the high speed interface 1230.

The device controller 120 can send a buffer command CMD_B to the data buffers 110. For example, the device controller 120 can output the buffer command CMD_B autonomously without the RAM command CMD_R and the RAM address ADDR_R or in response to the RAM command CMD_R and the RAM address ADDR_R. The buffer command CMD_B may be sent to the data buffers 110 in common.

The device controller 120 is configured to control the buffer memory 140 and communicate with the buffer memory 140. The buffer memory 140 may include a random access memory (RAM) such as DRAM, SRAM, PRAM, MRAM, RRAM, FeRAM, etc. The device controller 120 can load meta data for managing the nonvolatile memories 130 into the buffer memory 140. For example, the device controller 120 can load a mapping table including mapping information between logical addresses allocated to the nonvolatile memories 130 by the processor 1100 and physical addresses of the nonvolatile memories 130 into the buffer memory 140. The device controller 120 can read the mapping table from the nonvolatile memories 130 and load the read mapping table into the buffer memory 140. The buffer memory 140 may be included inside the device controller 120.

The SPD 150 is configured to communicate with the processor 1100 through supplemental signals SS of the high speed interface 1230. The SPD 150 is configured to communicate with the device controller 120 through the supplemental signals SS. The supplemental signals SS may include SPI (serial peripheral interface) signals, I2C (inter-integrated circuit) signals, UART (universal asynchronous receiver/transmitter) signals, etc. For example, the SPD 150 can store information about a physical characteristic, a logical characteristic, a driving characteristic of the storage device 100. The information stored in the SPD 150 may be read by the processor 1100 through supplemental signals SS of the high speed interface 1230 when a power supply is supplied to the computing device 1000.

Figure 3:
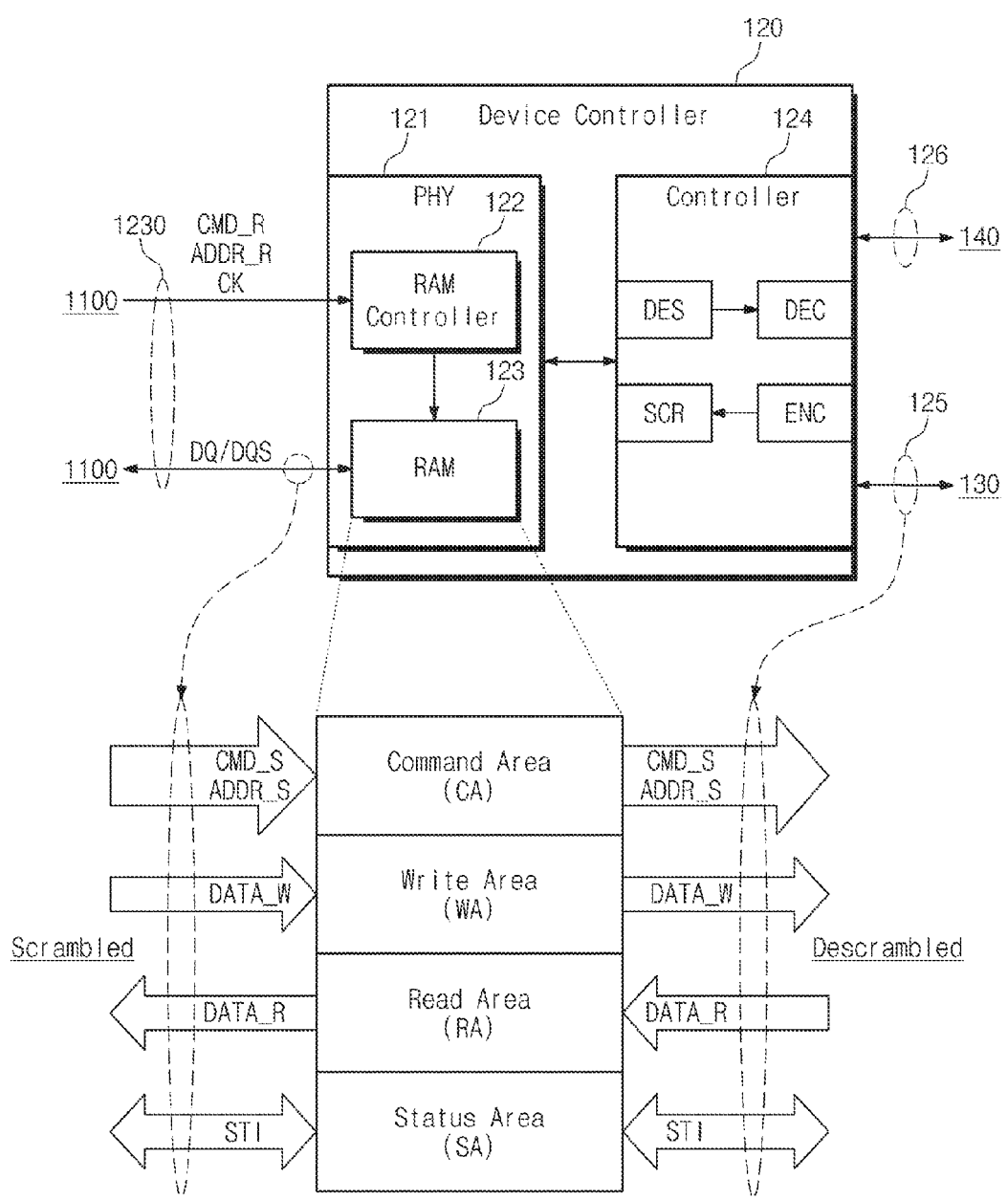
FIG. 3 is a block diagram illustrating a device controller in accordance with exemplary embodiments of the disclosure.

FIG. 3 is a block diagram illustrating a device controller 120 in accordance with exemplary embodiments of the disclosure. Referring to FIGS. 1, 2 and 3, the device controller 120 includes a physical layer circuit 121 or PHY and a controller 124.

The physical layer circuit 121 is configured to support communication according to a specification of the high speed interface 1230. For example, the physical layer circuit 121 is configured to support communication according to a specification of an RDIMM or a LRDIMM. The physical layer circuit 121 includes a RAM controller 122 and a RAM 123.

The RAM controller 122 is configured to receive a RAM command CMD_R, a RAM address ADDR_R and a clock CK through the high speed interface 1230. The RAM controller 122 can control the RAM 123 based on the RAM command CMD_R, the RAM address ADDR_R and the clock CK. For example, the RAM controller 122 can interpret a request of the processor 1100 based on the RAM command CMD_R and the RAM address ADDR_R. According to an interpretation result, the RAM controller 122 can control so that the RAM 123 exchanges data signals DQ and data strobe signals DQS with the processor 1100.

The RAM 123 can exchange data signals DQ and data strobe signals DQS with the processor 1100 through the high speed interface 1230 under the control of the RAM controller 122. The high speed interface 1230 may have a signal system based on a first type of memory, for example, an SDRAM. The RAM 123 may have a signal system based on a second type of memory, for example, an SRAM. Thus, the RAM 123 does not directly receive the RAM command CMD_R, the RAM address ADDR_R and the clock CK from the processor 1100 through the high speed interface 1230 and can exchange data signals DQ and data strobe signals DQS with the processor 1100 under the control of the RAM controller 122.

A storage space of the RAM 123 may be divided into a command area CA, a write area WA, a read area RA and a state area SA.

The storage command CMD_S and the storage address ADDR_S being stored in the RAM 123 from the processor 1100 as the data signals DQ may be written in the command area CA. Write data DATA_W being stored in the RAM 123 from the processor 1100 as the data signals DQ may be written in the write area WA. Read data DATA_R to be read from the RAM 123 by the processor 1100 as the data signals DQ may be stored in the read area RA and read from the read area RA. Status information STI being communicated with the RAM 123 by the processor 1100 as the data signals DQ may be stored in the status area SA and communicated in the state area SA. The status information STI may indicate information on an operation status of the processor 1100 or the storage device 100.

The controller 124 can communicate with the nonvolatile memories 130 through a first interface 125 and can communicate with the buffer memory 140 through a second interface 126. For example, the first interface may include a communication interface of a NAND flash memory, a PRAM, an MRAM, an RRAM, or an FeRAM. The second interface may include a communication interface of an SDRAM.

The controller 124 includes a descramble circuit DES, an error correction decoder DEC, an error correction encoder ENC and a scramble circuit SCR.

The processor 1100 is configured to write data in which at least one of a scramble and an error correction encoding is performed in the storage device 100 or the main memory device 1210 through the high speed interface 1230. The processor 1100 is configured to perform at least one of a descramble and an error correction decoding with respect to data being received from the storage device 100 or the main memory device 1210 through the high speed interface 1230.

In the case of the main memory device 1210, since the main memory device 1210 performs write and read operations under the control of the processor 1100, it does not perform an operation related to a scramble, a descramble, an error correction encoding and an error correction decoding.

The storage device 100 has to distinguish whether a data signal DQ being received through the high speed interface 1230 is a storage command CMD_S, a storage address ADDR_S, write data DATA_W, or read data DATA_R. The storage device 100 has to decode a storage command CMD_S and has to accurately distinguish a storage address ADDR_S.

Thus, the storage device 100 includes a descramble circuit DES descrambling a data signal DQ stored in the RAM 123 through the high speed interface 1230 and an error correction decoder DEC performing an error correction decoding. The storage device 100 includes an error correction encoder ENC performing an error correction encoding on data to be output as a data signal DQ through the high speed interface 1230 and a scramble circuit SCR performing a scramble.

In the case that the processor 1100 performs a swizzle exchanging locations of bits to transmit them or a bit-steering, the controller 124 may further include a deswizzle circuit restoring locations of exchanged bits to transmit them to the descramble circuit DES or a bit-steering circuit, and a swizzle circuit exchanging locations of bits being output from the scramble circuit SCR, or a bit-steering circuit.

The controller 124 descrambles or performs error correction decoding with respect to the storage command CMD_S and the storage address ADDR_S stored in the command area CA of the RAM 123 and then transmits the storage command CMD_S and the storage address ADDR_S to the nonvolatile memories 130 through the first interface 125. The controller 124 descrambles or performs error correction decoding with respect to the write data DATA_W stored in the write area WA of the RAM 123 and then transmits the write data DATA_W to the nonvolatile memories 130 through the first interface 125. The controller 124 scrambles or performs error correction encoding with respect to data DATA_R read from the nonvolatile memories 130 and then stores the data DATA_R in the read area RA of the RAM 123. The controller 124 scrambles or performs error correction encoding with respect to various information such as processing information of a write or read operation with respect to the nonvolatile memories 130 and information about an operation status of the storage device 100 and then writes the various information in the status area SA of the RAM 123 as status information STI. The controller 124 can read the various status information STI written in the status area SA of the RAM 123 through the high speed interface 1230 and can descramble or perform error correction decoding with respect to the various status information STI.

The physical layer circuit 121 may be configured to output the buffer command CMD_B to the data buffers 110. For example, the physical layer circuit 121 may be configured to output the buffer command CMD_B according to the RAM command CMD_R or the RAM address ADDR_R.

The controller 124 can exchange a storage command CMD_S, a storage address ADDR_S, write data DATA_W, and read data DATA_R which are descrambled and error-corrected with the nonvolatile memories 130 as input/output signals of the first interface 125. The storage command CMD_S, the storage address ADDR_S, the write data DATA_W, and the read data DATA_R may be communicated through common input/output lines. The controller 124 can exchange control signals being used to control the nonvolatile memories 130 with the nonvolatile memories through the first interface 125. The control signals can be communicated through control lines separated from input/output lines.

In an embodiment, the controller 124 may further include a second type error correction encoding circuit and a second type error correction decoding circuit. The second type error correction encoding and decoding circuits are used for correcting errors arising from a communication between the controller 124 and the nonvolatile memories 130 or in the nonvolatile memories 130. The second type error correction encoding circuit may encode data to be transmitted to the nonvolatile memories 130. The second type error correction decoding circuit may decode data received from the nonvolatile memories.

The controller 124 can transmit a chip enable signal /CE selecting at least one nonvolatile memory chip among the nonvolatile memories 130, a command latch enable signal CLE indicating that a signal being transmitted as an input/output signal is a storage command CMD_S, an address latch enable signal ALE indicating that a signal being transmitted as an input/output signal is a storage address ADDR_S, a read enable signal /RE that is periodically toggled in a read operation to be used to adjust timing, a write enable signal /WE being activated when a command or an address is transmitted, a write protection signal /WP being activated to prevent an unwanted write or erase when a power supply is changed, and a data strobe signal DQS that is periodically toggled in a write operation to be used to adjust a sync of write data DATA_W to the nonvolatile memories 130. The controller 124 may also receive a ready & busy signal R/Nb indicating that the nonvolatile memories 130 are performing a program, erase or read operation and a data strobe signal DQS that is generated from the read enable signal /RE by the nonvolatile memories 130 and periodically toggled to be used to adjust a sync of read data DATA_R from the nonvolatile memories 130.

Figure 4:
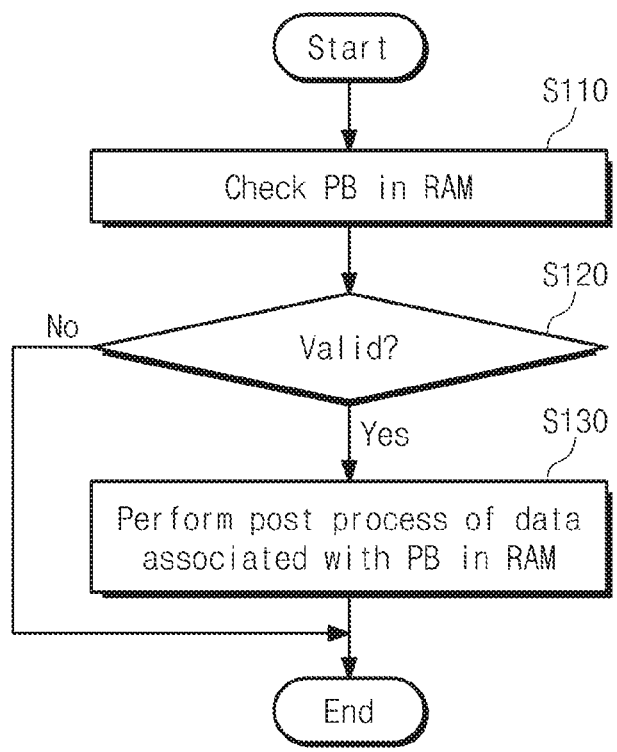
FIG. 4 is a flow chart illustrating an operation method of a storage device in accordance with exemplary embodiments of the disclosure.

FIG. 4 is a flow chart illustrating an operation method of a storage device in accordance with exemplary embodiments of the disclosure. Referring to FIGS. 2 through 4, in a step S110, the controller 124 checks whether phase bits PB stored in the RAM 123 are valid. The phase bits PB are received as a data signal DQ from the processor 1100 and may include information about whether data associated with the phase bits PB is valid or invalid. For example, the phase bits PB may be stored in the RAM 123 through the high speed interface 1230 together with a storage command CMD_S, a storage address ADDR_S, or a write data DATA_W.

If the phase bits PB indicate valid data (S120), the controller 124 can perform, in step S130, a subsequent process on data associated with the valid phase bits PB among data stored in the RAM 123 through the high speed interface 1230. If the phase bits PB indicate invalid data, the controller 124 may ignore data associated with the invalid phase bits PB among data stored in the RAM 123 so as not to perform a subsequent process.

Figure 5:
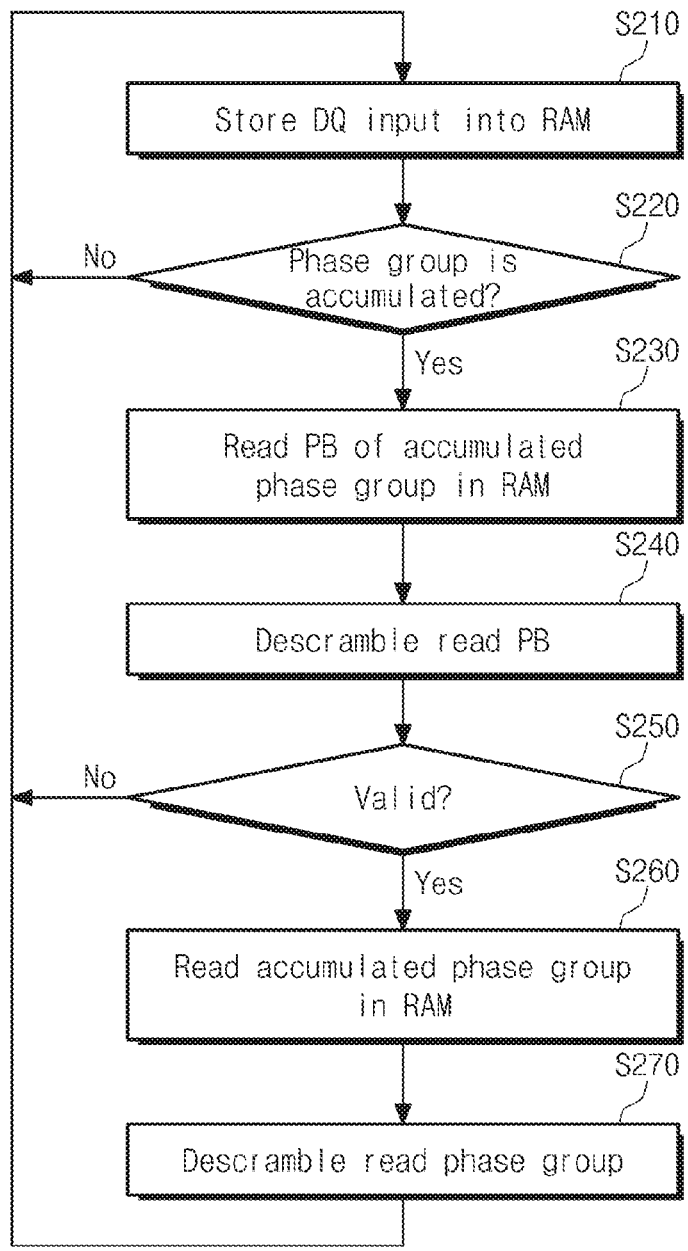
FIG. 5 is a flow chart illustrating a first example of an operation method of a storage device in accordance with exemplary embodiments of the disclosure.

FIG. 5 is a flow chart illustrating a first example of an operation method of a storage device in accordance with exemplary embodiments of the disclosure. Referring to FIGS. 1 through 3 and 5, in a step S210, the device controller 120 can store a data signal DQ being input through the high speed interface 1230 and the data buffers 110 in the RAM 123.

In a step S220, the device controller 120 judges whether a phase group is accumulated in the RAM 123. For example, the device controller 120 can judge whether a size of data stored in the RAM 123 reaches a size of a phase group. The phase group may be a unit of data associated with the phase bits PB. Each phase group may include associated phase bits PB. For example, a first phase group may be input from the processor 1100 together with first phase bits PB. A kth phase group may be input from the processor 1100 together with kth phase bits PB. The kth phase bits PB may include information indicating whether data of the kth phase group is valid or invalid.

Until data corresponding to a phase group is accumulated in the RAM 123, the steps S210 and S220 may be repeated. If data corresponding to a phase group is accumulated in the RAM 123, a step S230 is performed; otherwise flow does not pass to step S230.

In the step S230, the controller 124 can read phase bits of a phase group accumulated in the RAM 123 from the RAM 123. In a step S240, the controller 124 can perform a descramble operation on phase bits PB read from the RAM 123 using the descramble circuit DES. For example, the controller 124 may further perform an error correction decoding on descrambled phase bits using an error correction decoder DEC.

In a step S250, the controller 124 judges whether the descrambled phase bits PB have a valid value. For example, the descrambled phase bits PB have a valid pattern. If the descrambled phase bits PB do not have a valid value or pattern, a phase group accumulated in the RAM 123 may be ignored. If the descrambled phase bits PB have a valid value or pattern, a step S260 may be performed.

In the step S260, the controller 124 can read a phase group accumulated in the RAM 123 and corresponding to the phase bits PB determined as being valid from the RAM 123. After that, in a step S270, the controller 124 may perform a descramble operation with respect to a phase group read from the RAM 123. For example, the controller 124 may further perform an error correction decoding with respect to the descrambled phase group using an error correction decoder DEC.

As described with reference to FIG. 5, if a phase group is accumulated in the RAM 123, the controller 124 can descramble phase bits PB of a phase group to judge whether the phase group is valid. If the phase group is valid, the controller 124 can descramble the whole phase group. If the phase group is invalid, the controller does not descramble the phase group, but ignores it.

The processor 1100 may perform a read-modify-write operation. When performing a read-modify-write operation, the processor 1100 can perform a first write such that a part (e.g., half) of a write unit is written in the RAM 123. After that, the processor 1100 reads and modifies data written in the RAM 123 and then may perform a second write such that the whole of write unit is written in the RAM 123. When the processor 1100 performs the first write, phase bits PB may be set to have an invalid pattern or invalid values. When the processor 1100 performs the second write, the phase bits PB may be set to have a valid pattern or valid values. If phase bits PB are applied to data being written in the RAM 123, invalid data written in the RAM 123 is prevented from being descrambled and error-correct decoded. Since it is prevented that the storage device 100 performs an unnecessary operation, a speed of the storage device is improved.

Figure 6:
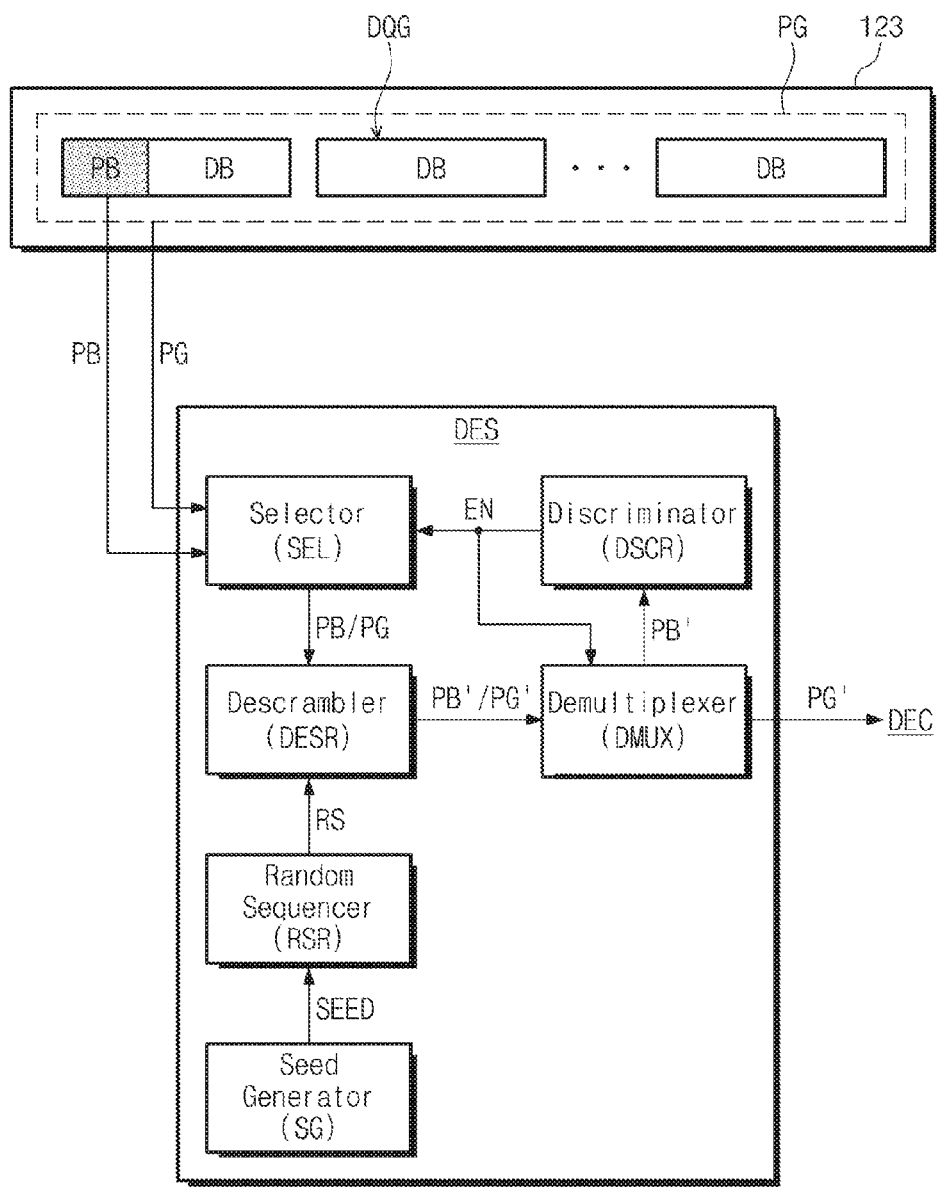
FIG. 6 is a block diagram illustrating a RAM having a descramble circuit and storing a phase group in accordance with exemplary embodiments of the disclosure.

FIG. 6 is a block diagram illustrating a RAM having a descramble circuit and storing a phase group in accordance with exemplary embodiments of the disclosure. Referring to FIGS. 1 and 6, a phase group stored in the RAM 123 includes phase bits PB and data bits DB. The phase bits PB and the data bits DB may be divided into a plurality of input/output groups DQG each of which is a unit of transmission from the processor 1100 to the RAM 123. Each of the input/output groups DQG may correspond to an input/output bandwidth of the high speed interface 1230. For example, each of the input/output groups DQG may correspond to the number of data signals DQ that can be communicated at a time through the high speed interface 1230.

For example, when an input/output bandwidth of data signals DQ of the high speed interface 1230 corresponds to 64 bits or 72 bits, each of the input/output groups DQG may have 64 bits or 72 bits. The number of phase bits PB may be smaller than the number of bits of one input/output group DQG but is not limited thereto. For example, a size of the phase group PG may be determined by a multiple of a burst length of a data communication through the high speed interface 1230. For example, a size of the phase group PG may be 64 bytes or 128 bytes but is not limited thereto.

The descramble circuit DES may include a selector SEL, a descrambler DESR, a random sequencer RSR, a seed generator SG, a demultiplexer DMUX and a discriminator DSCR.

The selector SEL can select one of a phase group PG and phase bits PB of the phase group stored in the RAM 123 in response to a control signal EN. For example, when the control signal EN is in an inactivated state, the selector SEL can select phase bits PB. The selector SEL can read only phase bits PB among the phase group PG stored in the RAM 123. When the control signal EN is in an activated state, the selector SEL can select the phase group PG. The selector SEL can read the whole phase group PG stored in the RAM 123. The phase bits PB or the phase group PG is transmitted to the descrambler DESR.

The descrambler DESR can perform a descramble operation on the phase bits PB or the phase group PG using a random sequence RS being transmitted from the random sequencer RSR. For example, when the phase group PG is transmitted from the selector SEL, the descrambler DESR can perform an exclusive OR on bits of the random sequence RS with bits of the phase group PG. When phase bits PB are transmitted from the selector SEL, the descrambler DESR can perform an exclusive OR on bits corresponding to locations of the phase bits PB among bits of the random sequence RS with the phase bits PB. Descrambled phase bits PB' or descrambled phase group PG' is transmitted to the demultiplexer DMUX.

The random sequencer RSR can generate a random sequence RS using a seed being transmitted from the seed generator SG. For example, the random sequencer RSR can generate a random sequence RS by shifting a seed SEED in rotation. For example, the random sequencer RSR can generate a random sequence RS by circulating a seed SEED using a linear feedback shift register LFSR.

The seed generator SG can generate a seed SEED to output it to the random sequencer RSR. For example, the seed generator SG can receive a RAM address ADDR_R from the RAM controller 122. The seed generator SG can output the received RAM address ADDR_R as a seed SEED.

The demultiplexer DUMX operates according to the control signal EN. For example, when the control signal EN is in an inactivated state, the demultiplexer DMUX can transmit an output of the descrambler DESR, that is, the descrambled phase bits PB' to the discriminator DSCR. When the control signal EN is in an activated state, the demultiplexer DMUX can transmit an output of the descrambler DESR, that is, the descrambled phase group PG' to the error correction decoder DEC.

The discriminator DSCR can receive descrambled phase bits PB' from the demultiplexer DMUX. If the descrambled phase bits PB' correspond to a valid pattern or valid values, the discriminator DSCR can activate the control signal EN. If the descrambled phase group PG' is output through the error correction decoder DEC, the discriminator DSCR can inactivate the control signal EN.

It is illustrated that phase bits PB are concentrated in one part inside the phase group PG. However, the phase bits PB may be distributed to be located throughout the phase group PG.

As described above, the descramble circuit DES can descramble only the phase bits PB and can judge whether the phase bits PB are valid. If the phase bits PB are valid, the descramble circuit DES can descramble the whole phase group PG.

Figure 7:
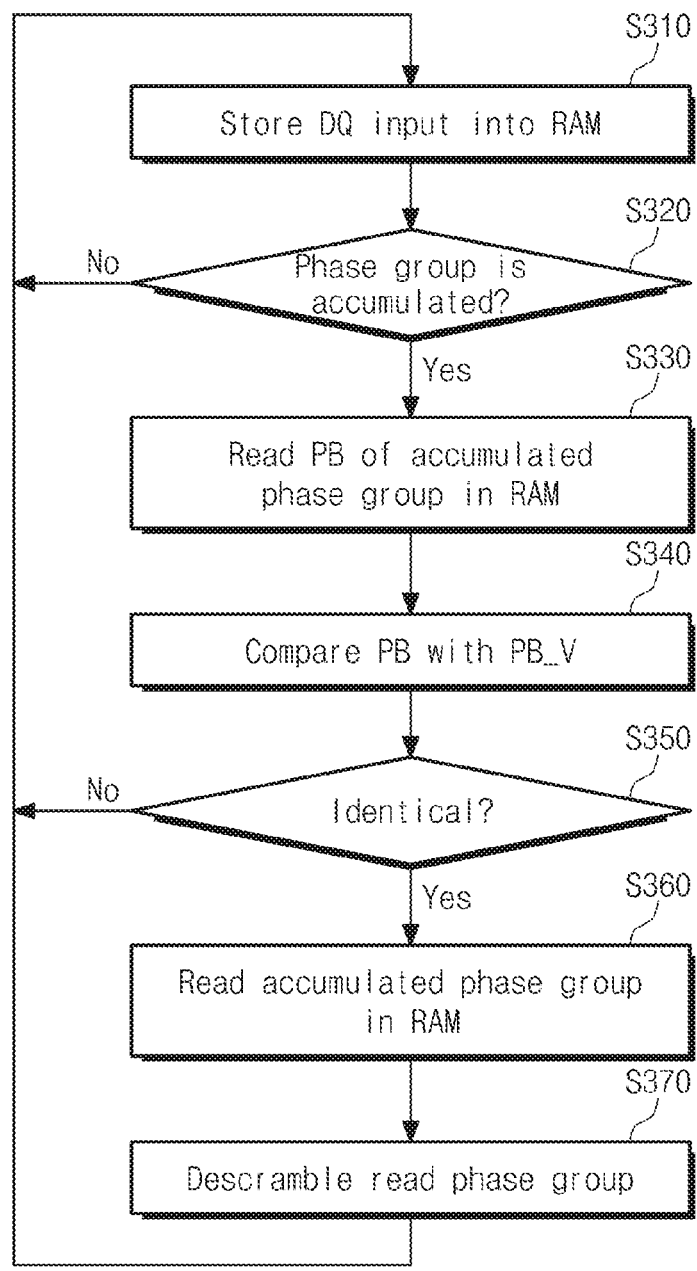
FIG. 7 is a flow chart illustrating a second example of an operation method of a storage device in accordance with exemplary embodiments of the disclosure.

FIG. 7 is a flow chart illustrating a second example of an operation method of a storage device in accordance with exemplary embodiments of the disclosure. Referring to FIGS. 1 through 3 and 7, in a step S310, the device controller 120 can store data signal DQ being input through the high speed interface 1230 and the data buffers 110 in the RAM 123.

In a step S320, the device controller 120 distinguishes whether a phase group is accumulated in the RAM 123. For example, the device controller 120 can distinguish whether a size of data stored in the RAM 123 through the high speed interface 1230 and the data buffers 110 reaches a size of a phase group. The steps S310 and S320 may be repeated until data corresponding to the phase group is accumulated in the RAM 123. If data corresponding to the phase group is accumulated in the RAM 123, a step S330 is performed.

In the step S330, the controller 124 can read phase bits PB of the phase group accumulated in the RAM 123 from the RAM 123. In a step S340, the controller 124 can compare phase bits PB read from the RAM 123 with a valid pattern PB_V. For example, the valid pattern PB_V may be a pattern of when phase bits PB have a valid pattern or when values of the phase bits are scrambled. That is, if the phase bits PB have a pattern identical with the valid pattern PB_V, it may be judged that phase bits PB before scrambling is performed or phase bits PB after scrambling is performed have a valid pattern or valid values.

In a step S350, if phase bits PB are not identical to the valid pattern PB_V, a phase group accumulated in the RAM 123 is ignored. If the phase bits PB are identical to the valid pattern PB_V, a step S360 is performed.

In the step S360, the controller 124 can read a phase group accumulated in the RAM 123 from the RAM 123. After that, in a step S370, the controller 124 can perform a descramble operation on a phase group read from the RAM 123. For example, the controller 124 can further perform an error correction decoding on the descrambled phase group using an error correction decoder DEC.

As described with reference to FIG. 7, if a phase group is accumulated in the RAM 123, the controller 124 can compare phase bits PB of the phase group with the valid pattern PB_V to judge whether the phase group is valid. If the phase group is valid, the controller 124 can descramble the whole phase group. If the phase group is invalid, the controller 124 does not descramble the phase group, but ignores it.

Figure 8:
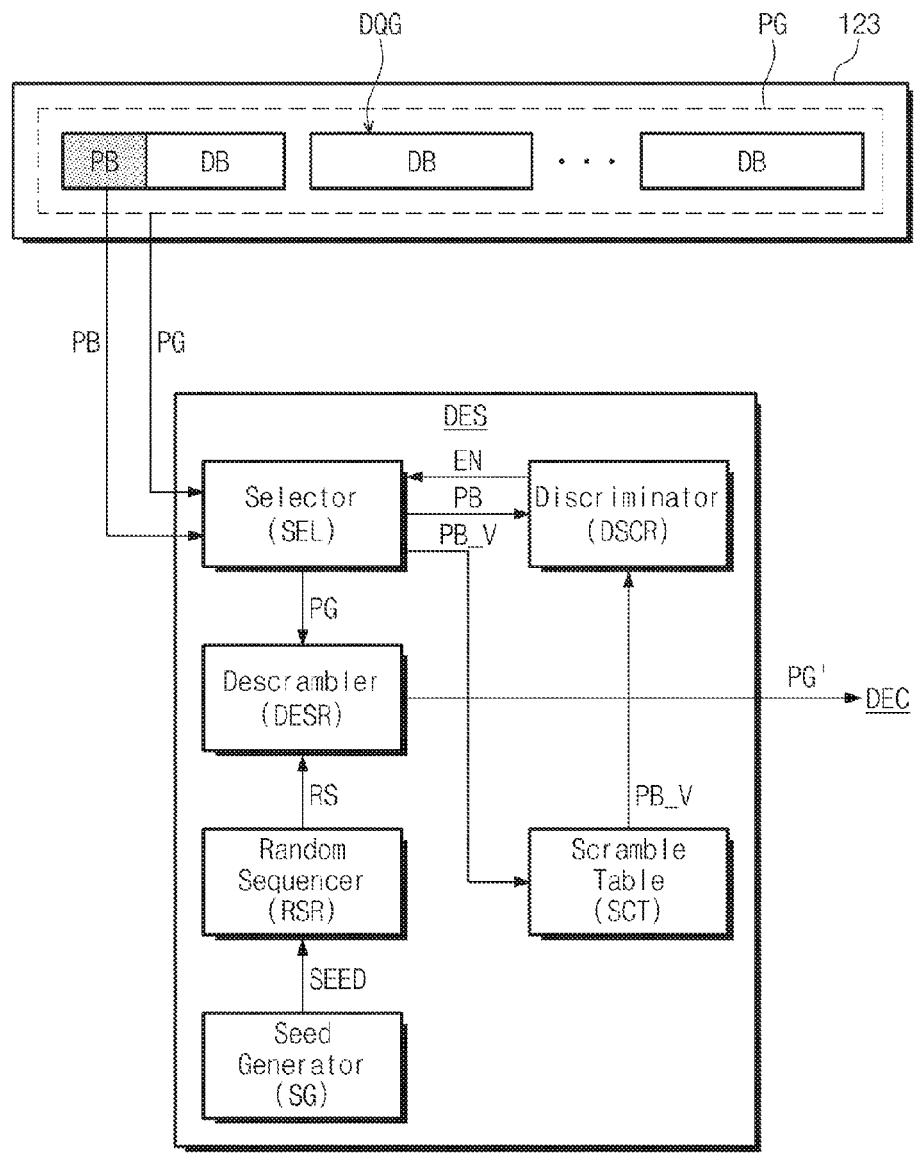
FIG. 8 is a block diagram illustrating a RAM having a descramble circuit DES and storing a phase group in accordance with other exemplary embodiments of the disclosure.

FIG. 8 is a block diagram illustrating a RAM 123 having a descramble circuit DES and storing a phase group PG in accordance with other exemplary embodiments of the disclosure. Referring to FIGS. 1 and 8, the phase group PG stored in the RAM 123 includes phase bits PB and data bits DB. The phase bits PB and the data bits DB are divided into a plurality of input/output groups DQG to be transmitted from the processor 1100 to the RAM 123. Each of the input/output groups DQG may correspond to an input/output bandwidth of the high speed interface 1230.

The descramble circuit DES includes a selector SEL, a descrambler DESR, a random sequencer RSR, a seed generator SG, a scramble table SCT, and a discriminator DSCR.

The selector SEL can select one of a phase group PG and phase bits PB of the phase group PG stored in the RAM 123. For example, when a control signal EN is in an inactivation state, the selector SEL can select phase bits PB. The selector SEL can read only phase bits PB in a phase group stored in the RAM 123 to transmit them to the discriminator DSCR. When the control signal EN is in an activation state, the selector SEL can select the phase group PG. The selector SEL can read the whole phase group PG stored in the RAM 123 to transmit it to the descrambler DESR. When the control signal EN indicates an initial mode, the selector SEL can read data of a location where phase bits PB are stored among storage spaces of the RAM 123 to output it as a valid pattern PB_V. The valid pattern PB_V is transmitted to a scramble table SCT.

The descrambler DESR can perform an exclusive OR with respect to bits of a random sequence RS with bits of the phase group PG. The descrambled phase group PG' is transmitted to the error correction decoder DEC.

The random sequencer RSR can generate the random sequence RS using a seed SEED being transmitted from the seed generator SG. For example, the random sequencer RSR can generate a random sequence RS by circulation shifting a seed SEED. For example, the random sequencer RSR can generate a random sequence RS by shifting a seed SEED in rotation. For example, the random sequencer RSR can generate a random sequence RS by circulating a seed SEED using a linear feedback shift register LFSR.

The seed generator SG can generate a seed SEED to output it to the random sequencer RSR. For example, the seed generator SG can receive a RAM address ADDR_R from the RAM controller 122. The seed generator SG can output the received RAM address ADDR_R as a seed SEED.

In a normal mode, the scramble table SCT can output the valid pattern PB_V. For example, the scramble table SCT can output the valid pattern PB_V based on a RAM address ADDR_R or a seed corresponding to the phase bits PB. In an initial mode, the scramble table SCT can store the valid pattern PB_V being transmitted from the selector SEL. For example, the scramble table SCT can store the RAM address ADDR_R or the seed SEED corresponding to the valid pattern PB_V in a table form in connection with the valid pattern PB_V.

In a normal mode, the discriminator DSCR can receive phase bits PB from the selector SEL and receive the valid pattern PB_V from the scramble table SCT. If the phase bits PB are identical to the valid pattern PB_V, the discriminator DSCR can activate the control signal EN. If the descrambled phase group PG' is output through the error correction decoder DEC, the discriminator DSCR can deactivate the control signal EN. In an initial mode, the discriminator DSCR can set the control signal EN to indicate the initial mode.

As described above, the descramble circuit DES can compare the phase bits PB with the valid pattern PB_V and distinguish whether the phase bits PB are valid. When the phase bits PB are valid, the descramble circuit DES can descramble the whole phase group PG. The valid pattern PB_V may be collected in an initial mode of the storage device 100.

Figure 9:
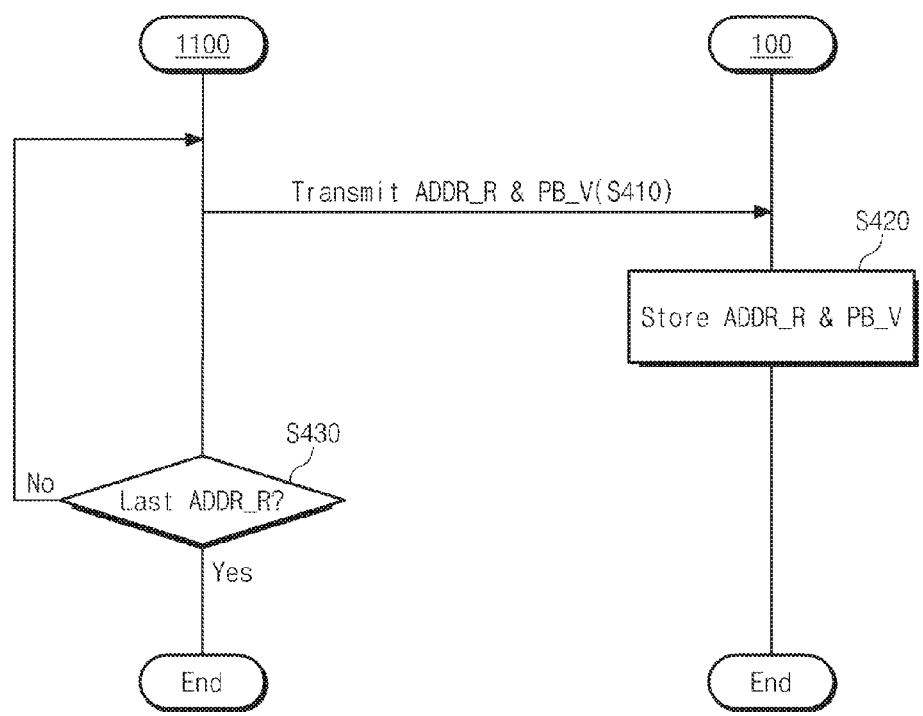
FIG. 9 is a flow chart illustrating a method in which a valid pattern is collected in an initialization mode.

FIG. 9 is a flow chart illustrating a method in which a valid pattern is collected in an initialization mode. Referring to FIGS. 1, 3, 8 and 9, in a step S410, the processor 1100 can transmit the valid pattern PB_V to the storage device 100. For example, the processor 1100 can generate phase bits PB having a valid pattern or valid values and scramble the generated phase bits PB. The scrambled phase bits PB may be a valid pattern PB_V. The valid pattern PB_V may be written in the RAM 123 as a data signal DQ.

The valid pattern PB_V may be written in locations allocated to the phase bits PB inside the phase group PG. The processor 1100 may further transmit the RAM address ADDR_R indicating a location where the valid pattern PB_V is to be written inside a storage space of the RAM 123. The RAM address ADDR_R may indicate locations where the phase bits PB are written inside the storage space of the RAM 123.

For example, the processor 1100 can write only the valid pattern PB_V in the RAM 123 as a data signal DQ. As another example, the processor 1100 can form a phase group PG with the valid pattern PB_V and dummy data to write it in the RAM 123.

In a step S420, the valid pattern PB_V is written in a storage space of the RAM 123 corresponding to the RAM address ADDR_R. The scramble table SCT of the descramble circuit DES can store the RAM address ADDR_R and the valid pattern PB_V in table form.

The steps S410 and S420 may be repeated until a transmission of the last valid pattern PB_V and the last RAM address ADDR_R corresponding to the last valid pattern PB_V is completed (S430). That is, the processor 1100 can write the valid pattern PB_V in all locations where the phase bits PB are written inside the storage space of the RAM 123. The scramble table SCT can store RAM addresses ADDR_R of all the storage spaces of the RAM 123 in which the phase bits PB are written and valid patterns PB_V corresponding to the RAM addresses ADDR_R.

As described with reference to FIGS. 6 and 8, the phase bits PB can be scrambled based on the RAM address ADDR_R. Thus, even if the processor 1100 transmits phase bits PB having the same pattern or the same value, the phase patterns PB are scrambled to different patterns or different values depending on a RAM address ADDR_R of the RAM 123 in which the phase bits PB are written. Thus, in an initial mode, the descramble circuit DES can collect RAM addresses ADDR_R of all the storage spaces of the RAM 123 in which the phase bits PB are written and valid patterns PB_V corresponding to the RAM addresses ADDR_R.

Each of the command area CA, the write area WA, the read area RA and the status area SA of the RAM 123 may be embodied in a ring buffer form. When the processor 1100 performs a write of a kth circulation of a ring buffer structure of the RAM 123, the processor 1100 can generate a first pattern as valid phase bits PB and scramble it. When the processor 1100 performs a write of a k+1 th circulation of a ring buffer structure of the RAM 123, the processor 1100 can generate a second pattern as valid phase bits PB. The first and second patterns may be complementary to each other. For example, if the first pattern is '101', the second pattern may be '010'.

That is, in the same RAM address ADDR_R, a valid pattern PB_V may become different depending on the order of circulation of the ring buffer structure. Thus, the scramble table SCT can store two or more valid patterns PB_V with respect to the same RAM address ADDR_R.

Figure 10:
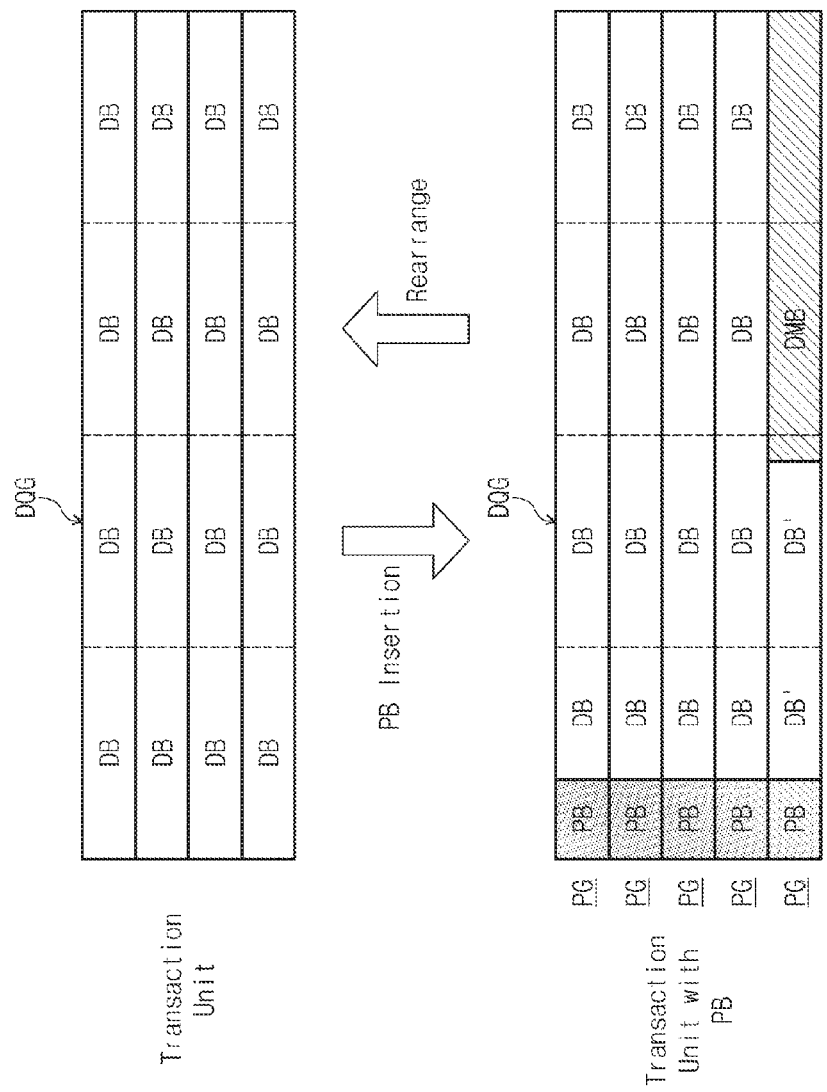
FIG. 10 illustrates an example that a transaction unit is changed according to phase bits.

FIG. 10 illustrates an example in which a transaction unit is changed according to phase bits. The processor 1100 can write data of a predetermined size in the RAM 123 or read data of a predetermined size from the RAM 123 in a write or read transaction operation with respect to the RAM 123. For example, the processor 1100 can write data in the RAM 123 or read data from the RAM 123 through the high speed interface 1230 by a 4 kilobyte unit or an 8 kilobyte unit, but is not limited thereto.

In the case that phase bits PB are not used, a transaction unit may be divided into a plurality of input/output groups DQG to be transmitted from the processor 1100 to the RAM 123. As illustrated at an upper part of FIG. 10, a transaction unit is determined by a multiple of the input/output group DQG.

In the case that phase bits PB are inserted, as illustrated in a lower part of FIG. 10, the phase bits PB are transmitted from the processor 1100 to the RAM 123 together with data bits DB of the transaction unit illustrated at an upper part of FIG. 10. Since the phase bits PB are added to each phase group PG, untransmitted data bits DB' exist. The untransmitted data bits DB' are transmitted from the processor 1100 to the RAM 123 through an additional phase group PG. In the case that a size of the untransmitted data bits DB' is smaller than a size of the phase group PG, the untransmitted data bits DB' can form the phase group PG together with dummy bits DMB.

The controller 124 can process data stored in the RAM 123 based on the transaction unit. For example, the controller 124 can perform a descramble operation and an error correction decoding on the basis of the transaction unit. Since the transaction unit includes dummy bits DMB and phase bits PB, the controller 124 can perform a rearrange operation of removing the dummy bits DMB and the phase bits PB and generating a data processing unit.

Figure 11:
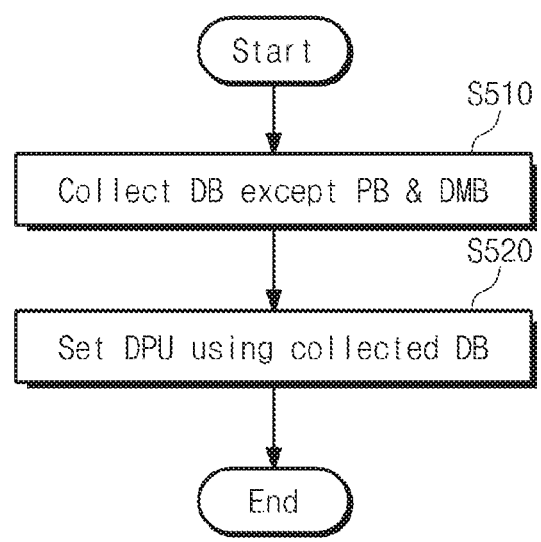
FIG. 11 is a flow chart illustrating an example that a controller performs a rearrange operation.

FIG. 11 is a flow chart illustrating an example in which a controller 124 performs a rearrange operation. Referring to FIGS. 1, 3, 10 and 11, in a step S510, the controller 124 can collect data bits DB, but not phase bits PB and dummy bits DMB. In a step S520, the controller 124 can set a data processing unit DPU using the collected data bits DB. For example, the controller 124, as illustrated at the upper part of FIG. 10, can rearrange data bits to set the data processing unit DPU.

Figure 12:
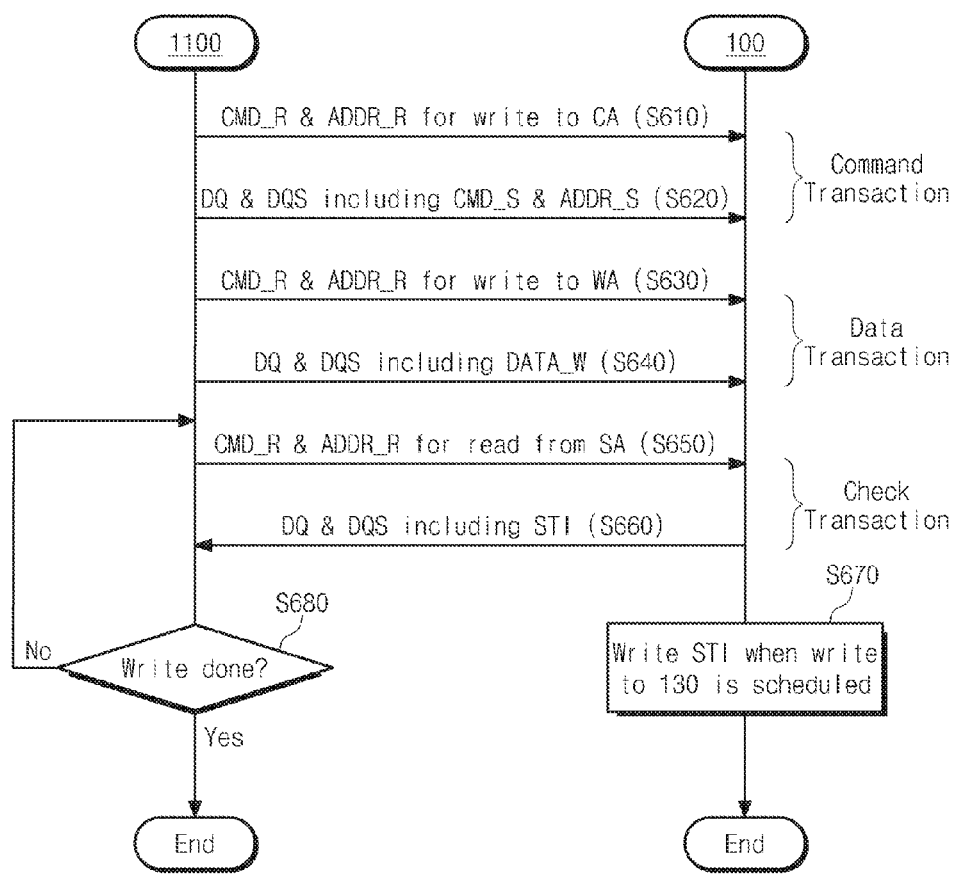
FIG. 12 is a flow chart illustrating a method in which a processor writes data in a storage device according to exemplary embodiments of the disclosure.

FIG. 12 is a flow chart illustrating a method in which a processor 1100 writes data in a storage device 100 according to exemplary embodiments of the disclosure. A method in which the processor 1100 writes data in the nonvolatile memories 130 is illustrated in FIG. 12.

Referring to FIGS. 1, 2, 3 and 12, in a step S610, the processor 1100 transmits a RAM command CMD_R, requesting a write operation, and a RAM address ADDR_R selecting a command area CA of the RAM 123. In a step S620, the processor 1100 transmits a storage command CMD_S, requesting a write operation, and a storage address ADDR_S selecting a target address of a write operation, among addresses of a storage space of the nonvolatile memories 130, to the storage device 100 through data signals DQ and data strobe signals DQS.

The step S610 and the step S620 can form a command transaction of transmitting a write command with respect to the nonvolatile memories 130 to the storage device 100. If the step S610 and the step S620 are performed, the storage command CMD_S and the storage address ADDR_S are written in the command area CA of the RAM 123.

In a step S630, the processor 1100 transmits a RAM command CMD_R, requesting a write operation, and a RAM address ADDR_R, selecting the write area WA of the RAM 123, to the storage device 100. In a step S640, the processor 1100 transmits write data DATA_W to the storage device 100 through data signals DQ and the data strobe signals DQS.

The step S630 and the step S640 can form a data transaction of transmitting write data DATA_W, with respect to the nonvolatile memories 130, to the storage device 100. If the step S630 and the step S640 are performed, the write data DATA_W is written in the write area WA of the RAM 123.

As the storage command CMD_S, the storage address ADDR_S and the write data DATA_W are stored in the RAM 123, the controller 124 may begin a write with respect to the nonvolatile memories 130 of the write data DATA_W in response to the storage command CMD_S and the storage address ADDR_S.

The storage command CMD_S, the storage address ADDR_S and the write data DATA_W may be written in the command area CA of the RAM 123 as one or more phase groups PG. The controller 124 can check phase bits PB of the phase group PG written in the command area CA and if the phase bits PB are valid, the controller 124 can descramble the phase group PG.

In a step S650, the processor 1100 transmits a RAM command CMD_R, requesting a read operation, and a RAM address ADDR_R, selecting the status area SA, to the storage device 100. In a step S660, the processor 1100 can read status information STI from the storage device 100 as data signals DQ and data strobe signals DQS. The step S650 and the step S660 can form a check transaction, checking whether a write operation is processed.

If a write operation with respect to the nonvolatile memories 130 is finished or scheduled in the storage device 100, the storage device 100 can write status information STI providing notification that a write operation is processed in the status area SA (S670). The processor 1100 may periodically repeat the step S650 and the step S660 until the status information STI, providing notification that a write operation is processed, is read from the status area SA. If the status information STI is read from the storage device 100 (S680), the processor 1100 judges that a write operation of the storage device 100 is processed and may perform a next access with respect to the storage device 100.

Figure 13:
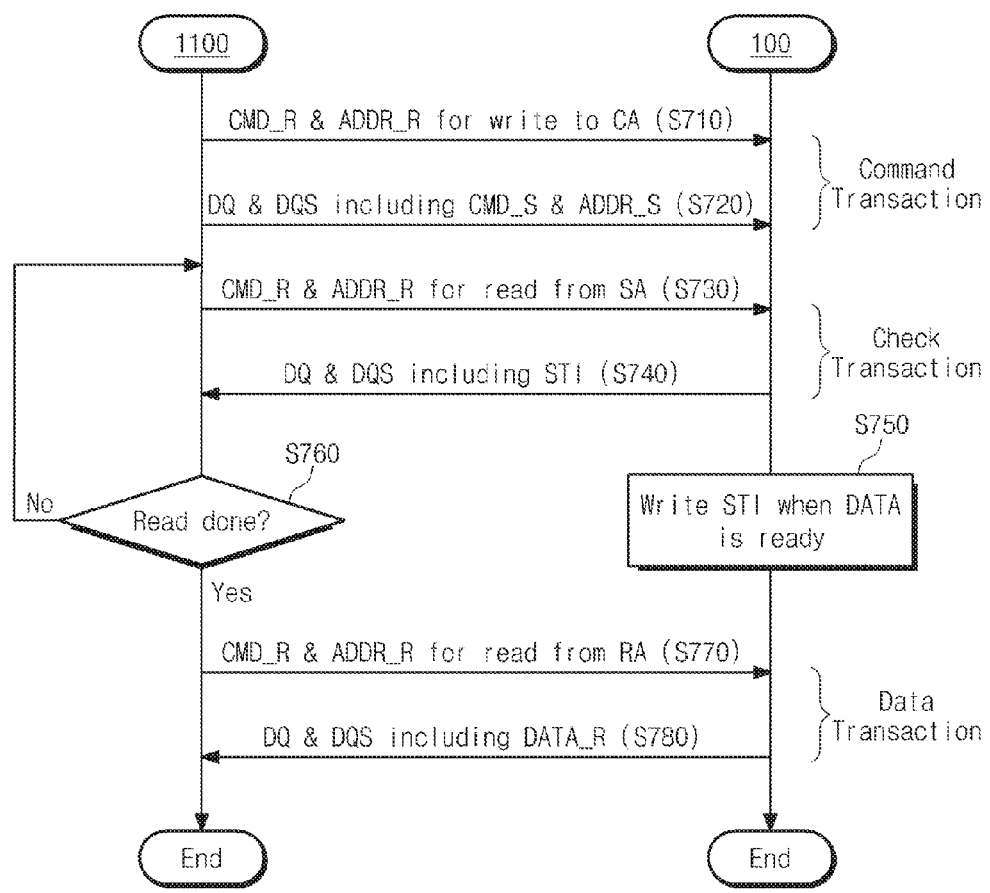
FIG. 13 is a flow chart illustrating a method in which a processor reads data from a storage device according to exemplary embodiments of the disclosure.

FIG. 13 is a flow chart illustrating a method in which a processor 1100 reads data from a storage device 100 according to exemplary embodiments of the disclosure. A method in which the processor 1100 reads data from the nonvolatile memories 130 is illustrated in FIG. 13.

Referring to FIGS. 1, 2, 3 and 13, in a step S710, the processor 1100 transmits a RAM command CMD_R, requesting a write operation, and a RAM address ADDR_R selecting a command area CA of the RAM 123. In a step S720, the processor 1100 transmits a storage command CMD_S requesting a read and a storage address ADDR_S, selecting a target address of a read among addresses of a storage space of the nonvolatile memories 130, to the storage device 100 through data signals DQ and data strobe signals DQS.

The step S710 and the step S720 can form a command transaction of transmitting a read command with respect to the nonvolatile memories 130 to the storage device 100. If the step S710 and the step S720 are performed, the storage command CMD_S and the storage address ADDR_S are written in the command area CA of the RAM 123.

The storage command CMD_S and the storage address ADDR_S may be written in the command area CA of the RAM 123 as one or more phase groups PG. The controller 124 can check phase bits PB of the phase group PG written in the command area CA and, if the phase bits PB are valid, the controller 124 can descramble the phase group PG.

As the storage command CMD_S is descrambled, the controller 124 may begin a read operation of read data DATA_R from the nonvolatile memories 130 in response to the storage command CMD_S and the storage address ADDR_S. For example, the controller 124 can store read data DATA_R in the read area RA of the RAM 123.

In a step S730, the processor 1100 transmits the RAM command CMD_R, requesting a read operation, and the RAM address ADDR_R, selecting the status area SA, to the storage device 100. In a step S740, the processor 1100 can read status information STI from the storage device 100 as data signals DQ and data strobe signals DQS. The step S730 and the step S740 can form a check transaction checking whether a read operation is completed.

If a read from the nonvolatile memories 130 is completed in the storage device 100, the storage device 100 can write status information STI providing notification that a read operation is completed in status area SA (S750). The processor 1100 can periodically repeat the step S730 and the step S740 until the status information STI, providing notification that a read operation is completed, is read from the status area SA.

If the status information STI is read from the storage device 100, the processor 1100 may judge that a read operation of the storage device 100 is completed (S760). In a step S770, the processor 1100 transmits the RAM command CMD_R, requesting a read operation, and a RAM address ADDR_W, selecting the read area RA of the RAM 123, to the storage device 100.

In a step S780, the processor 1100 can receive the read data DATA_R from the storage device 100 as the data strobe signals DQS and the data strobe signals DQS. The step S770 and the step S780 can form a data transaction of transmitting data DATA_R read from the nonvolatile memories 130.

As described above, the processor 1100 can distinguish that the RAM 123 is a memory connected to the high speed interface 1230 and can perform a write operation and a read operation with respect to the RAM 123 according to a specification of the high speed interface 1230. Data being written in the RAM 123 or read from the RAM 123 includes a storage command CMD_S requesting an access of the nonvolatile memories 130, a storage address CMD_S, and write data DATA_W and read data DATA_R that are communicated with the nonvolatile memories 130.

The storage device 100 can support communication between the RAM 123 and the processor 1100 according to a specification of the high speed interface 1230. The storage device 100 can extract the storage command CMD_S and the storage address ADDR_S from data stored in the RAM 123. The storage device 100 can write the write data DATA_W stored in the RAM 123 and can store data DATA_R read from the nonvolatile memories 130 in the RAM 123.

A communication between the processor 1100 and the storage device 100 is performed according to the specification of the high speed interface 1230 and data being communicated according to the specification of the high speed interface 1230 may be organized according to a protocol for accessing the nonvolatile memories 130.

Figure 14:
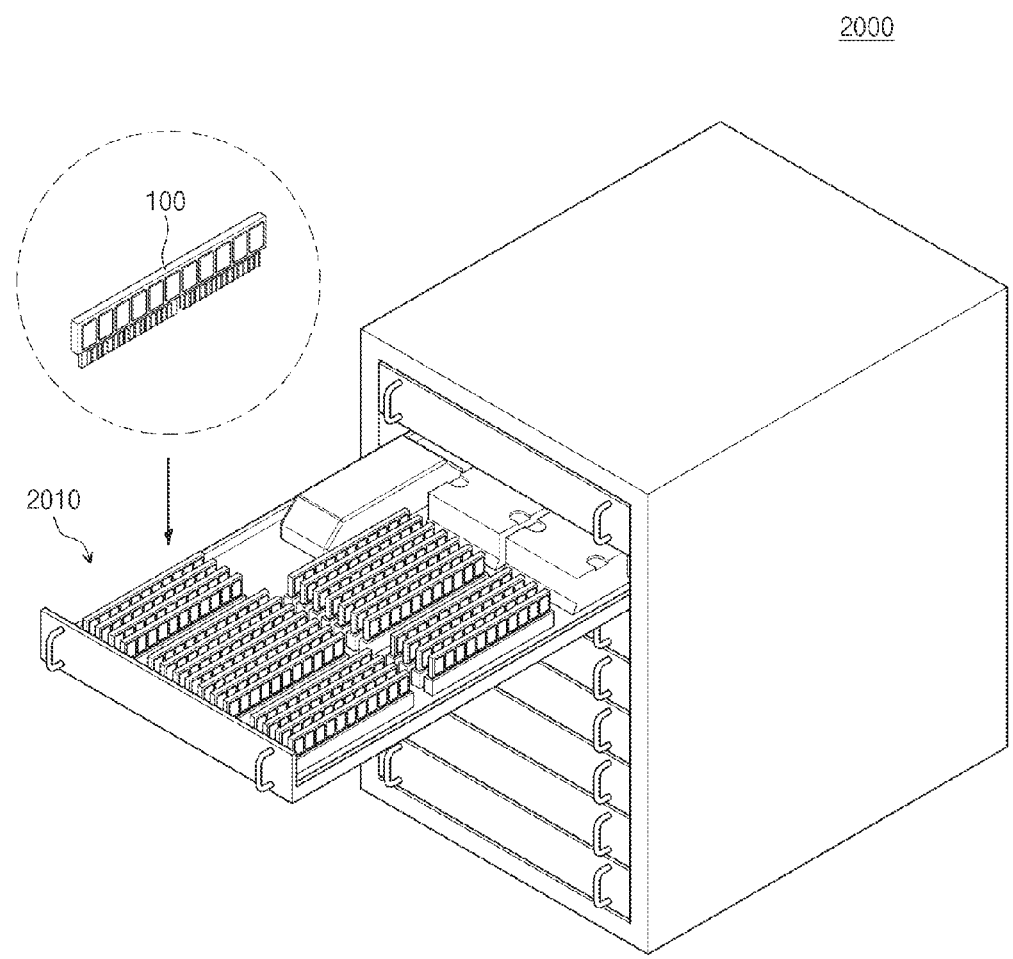
FIG. 14 illustrates an example of a sever device on which a storage device is mounted.

FIG. 14 illustrates an example of a server device 2000 on which a storage device 100 is mounted. Referring to FIG. 14, the server device 2000 may include two or more racks 2010. Two or more storage devices 100 may be mounted on each rack 2010.

The storage devices 100, the main memory devices 1210, the at least one processor 1100, the at least one chipset 1300 and the at least one storage device 1700 may be mounted on each of racks 2010. The input/output device 1600, the graphic processor 1400 and the display device 1500 may be provided to the server device 2000.

Figure 15:
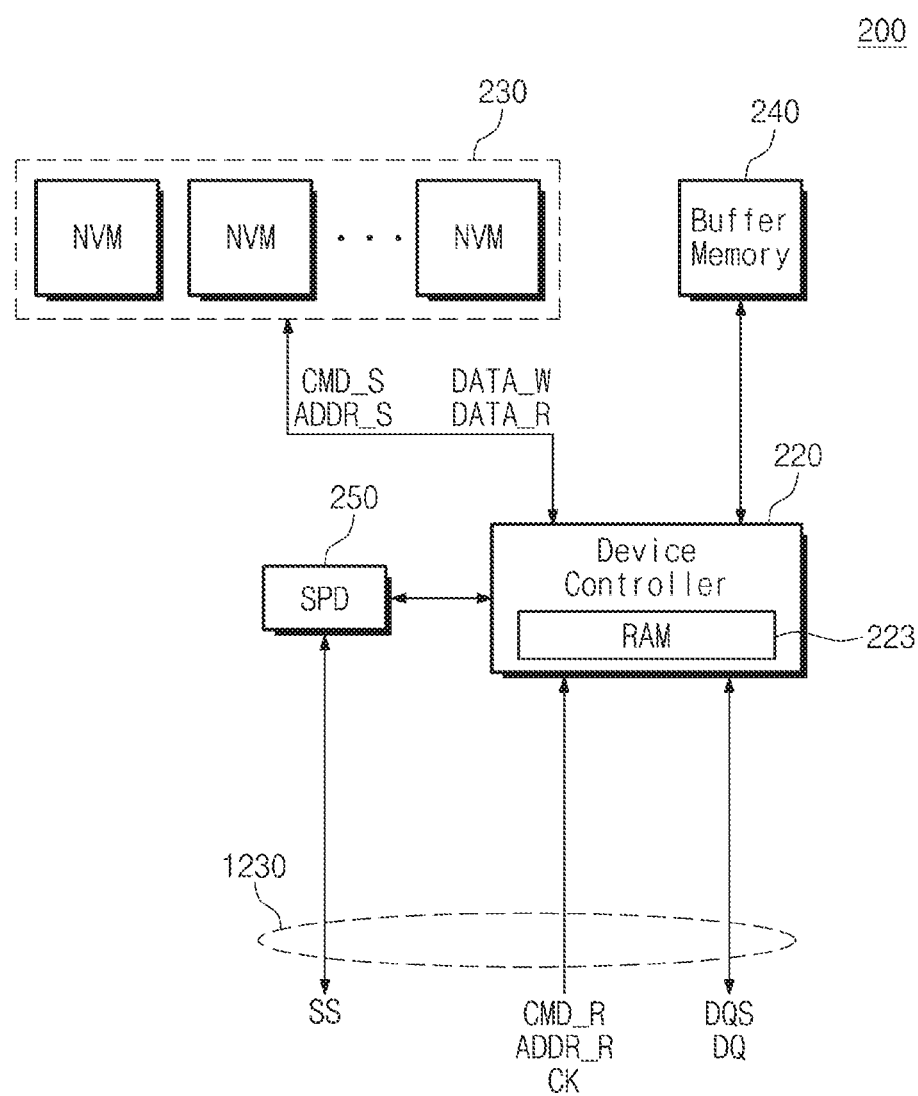
FIG. 15 is a block diagram illustrating a storage device in accordance with a second embodiment of the disclosure.

FIG. 15 is a block diagram illustrating a storage device 200 in accordance with a second embodiment of the disclosure. Referring to FIG. 15, the storage device 200 includes a device controller 220, nonvolatile memories 230, a buffer memory 240 and an SPD 250. The device controller 220 includes a RAM 223. The storage device 200 can exchange a data signal DQ, a data strobe signal DQS and a supplemental signal SS with the processor 1100 through the high speed interface 1230 and can receive a RAM command CMD_R, a RAM address ADDR_R and a clock CK from the processor 1100. The device controller 220 can write the write data DATA_W being received as the data signal DQ in the nonvolatile memories 230. The device controller 220 can output data DATA_R read from the nonvolatile memories 230 as the data signal DQ through the high speed interface 1230.

The data buffers 110 are not provided in the storage device 200, as they are with the storage device 100 of FIG. 2. The data signal DQ and the data strobe signal DQS may be directly transmitted to the device controller 220 through the high speed interface 1230. The high speed interface 1230 may operate according to a specification of RDIMM. The device controller 220 can communicate with the processor 1100 through the high speed interface 1230 according to the specification of RDIMM.

Except for an operation according to the specification of RDIMM, the storage device 200 may operate as described with reference to FIGS. 3 through 13. The device controller 220 can receive a phase group PG including phase bits PB as a data signal DQ through the high speed interface 1230. The device controller 220 can check the validity of the phase bits PB by descrambling the phase bits PB or comparing the phase bits PB with the valid pattern PB_V. In the case that the phase bits PB are valid, the device controller 220 can descramble the phase group PG. The device controller 220 can remove phase bits PB of phase groups PG and dummy bits DMB that belong to a transaction unit and can set a data processing unit DPU using data bits DB.

Figure 16:
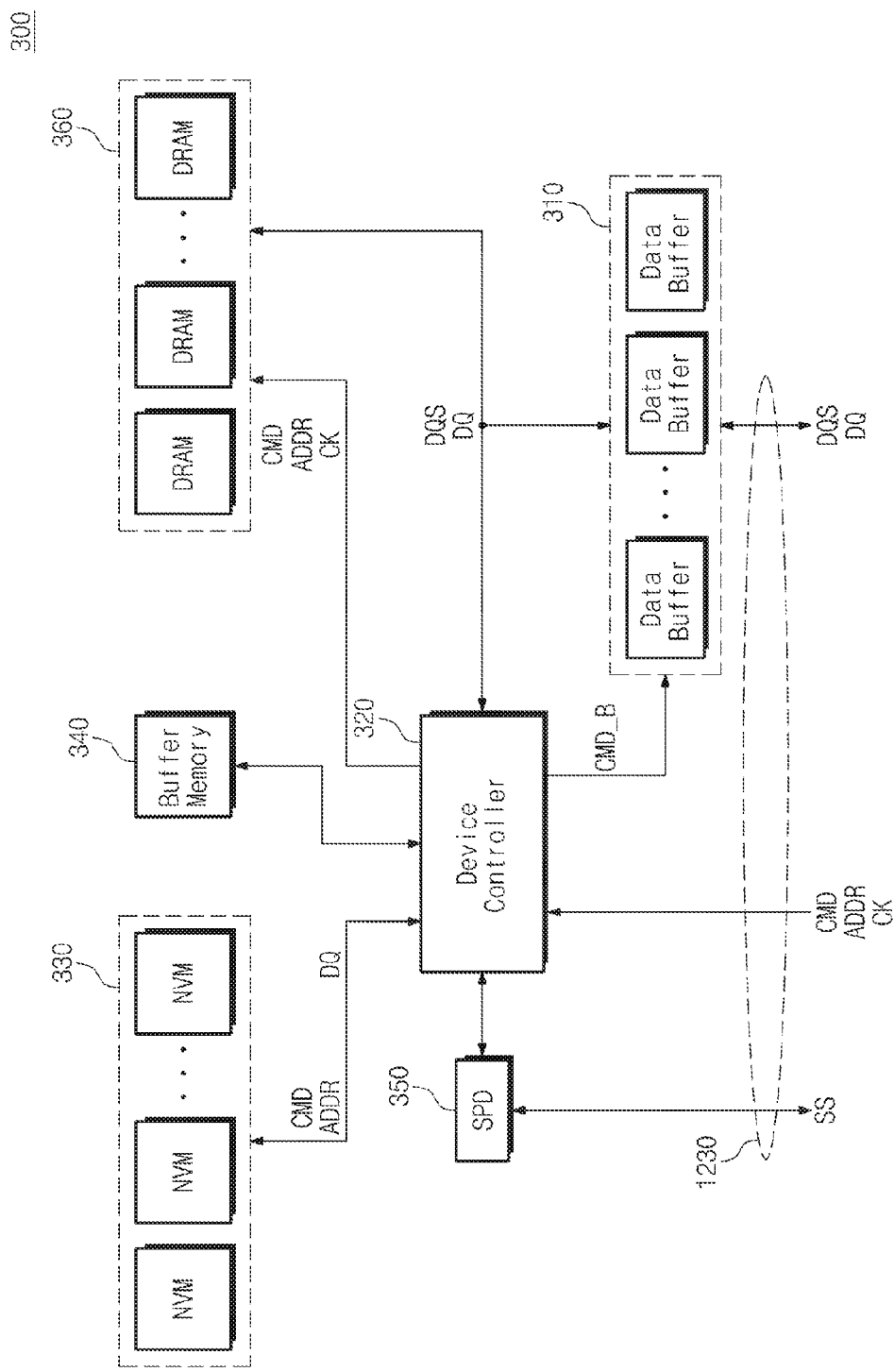
FIG. 16 is a block diagram illustrating a hybrid storage device in accordance with a third embodiment of the disclosure.

FIG. 16 is a block diagram illustrating a hybrid storage device 300 in accordance with a third embodiment of the disclosure. Referring to FIGS. 1 and 16, the hybrid storage device 300 includes data buffers 310, a device controller 320, nonvolatile memories 330, a buffer memory 340, an SPD 350, and random access memories 360. The hybrid storage device 300 may be connected to the processor 1100 through the high speed interface 1230, for example, a DIMM, an RDIMM or an LRDIMM interface.

The nonvolatile memories 330 and the random access memories 360 of the hybrid storage device 300 may be identified in a physical layer of the processor 1100. In the case that the processor 1100 accesses the nonvolatile memories 330, the processor 1100 can directly transmit a command CMD, with respect to the nonvolatile memories 330, and an address ADDR, indicating a storage space of the nonvolatile memories 330, to the device controller 320 through the high speed interface 1230. The processor 1100 can exchange data to be written in the nonvolatile memories 330 or data read from the nonvolatile memories 330 with the data buffers 310 as a data signal DQ.

In the case that the processor 1100 accesses the random access memories 360, the processor 1100 can directly transmit a command CMD, with respect to the random access memories 360, and an address ADDR, indicating a storage space of the random access memories 360, to the device controller 320 through the high speed interface 1230. The processor 1100 can exchange data to be written in the random access memories 360 or data read from the random access memories 360 with the data buffers 310 as a data signal DQ.

The data buffers 310 operate in response to a buffer command CMD_B. The data buffers 310 can exchange a data signal DQ and a data strobe signal DQS with the processor 1100 through the high speed interface 1230. The data buffers 310 can output the data signal DQ and the data strobe signal DQS being received from the processor 1100 to the device controller 320 or the random access memories 360. The data buffers 310 can transmit the data signal DQ and the data strobe signal DQS being received from the device controller 320 or the random access memories 360 to the processor 1100 through the high speed interface 1230.

The data buffers 310 can select a target address with which the data buffers 310 exchange the data signal DQ and the data strobe signal DQS under the control of the device controller 320. For example, the data buffers 310 can exchange the data signal DQ and the data strobe signal DQS with the device controller 320 under the control of the device controller 320. As another example, the data buffers 310 can exchange the data signal DQ and the data strobe signal DQS with the random access memories 360 under the control of the device controller 320.

The device controller 320 can receive a command CMD, an address ADDR and a clock CK from the processor 1100 through the high speed interface 1230. The device controller 320 is configured to control the data buffers 310 through a buffer command CMD_B.

In response to the command CMD, the address ADDR or a control signal being received through the high speed interface 1230, the device controller 320 can distinguish whether a target which the processor 1100 accesses is nonvolatile memory 330 or the random access memory 360.

In the case that the access target is the nonvolatile memory 330, the device controller 320 can control the data buffers 310 to exchange the data signal DQ and the data strobe signal DQS with the device controller 320. The device controller 320 can output the command CMD and the address ADDR received through the high speed interface 1230 to the nonvolatile memories 330. The device controller 320 can transmit the data signals DQ being received from the data buffers 310 to the nonvolatile memories 330. The device controller 320 may include an internal buffer buffering data of a data signal DQ to be transmitted to the nonvolatile memories 330 or data of a data signal DQ being read from the nonvolatile memories 330. As another example, the device controller 320 can buffer data of a data signal DQ to be transmitted to the nonvolatile memories 330 or data of a data signal DQ being read from the nonvolatile memories 330 in the buffer memory 340.

The storage device 300 may operate as described with reference to FIGS. 3 through 13. The device controller 320 can check the validity of the phase bits PB by descrambling the phase bits PB of the phase group PG stored in the internal buffer or the buffer memory 340, or comparing the phase bits PB with the valid pattern PB_V. In the case that the phase bits PB are valid, the device controller 320 can descramble the phase group PG. The device controller 320 can remove phase bits PB of phase groups PG and dummy bits DMB that belong to a transaction unit and can set a data processing unit DPU using data bits DB.

In the case that the access target is the random access memory 360, the device controller 320 can control the data buffers 310 to exchange the data signal DQ and the data strobe signal DQS with the random access memory 360. The device controller 320 can output the command CMD, the address ADDR and the clock CK received through the high speed interface 1230 to the random access memory 360.

The nonvolatile memories 330 can write data being transmitted as a data signal DQ in response to the command CMD and the address ADDR. In response to the command CMD and the address ADDR, the nonvolatile memories 330 can read data and output the read data as a data signal DQ.

The buffer memory 340 may correspond to the buffer memory 140 of FIG. 2. The buffer memory 340 can load meta data for managing the nonvolatile memories 330.

The SPD 350 corresponds to the SPD 150 of FIG. 2. The SPD 350 can communicate a supplemental signal SS through the high speed interface 1230.

The random access memories 360 can write data being transmitted as a data signal DQ in response to the address ADDR and the clock CK. In response to the command CMD, the address ADDR and the clock CK, the random access memories 360 can read data and output the read data as a data signal DQ.

The device controller 320 can exchange the command CMD, the address ADDR and the data signal DQ with the nonvolatile memories 330 as input/output signals. For example, the command CMD, the address ADDR and the data signal DQ can be communicated through common input/output lines. The device controller 320 can further exchange control signals being used to control the nonvolatile memories 330 with the nonvolatile memories 330. The control signals can be communicated through control lines separated from the input/output lines.

For example, the device controller 320 can receive a chip enable signal /CE selecting at least one semiconductor memory chip among the nonvolatile memories 330, a command latch enable signal CLE indicating that a signal being transmitted as an input/output signal is a storage command CMD_S, an address latch enable signal ALE indicating that a signal being transmitted as an input/output signal is a storage address ADDR_S, a read enable signal /RE which is periodically toggled to be used to adjust the timing, a write enable signal /WE activated when a command or an address is transmitted, a write preventing signal /WP activated to prevent an unwanted erase operation or an unwanted write operation when a power supply is changed, and a data strobe signal DQS which is periodically toggled to be used to adjust a sync of the data to the nonvolatile memories 330. The device controller 320 can receive a ready & busy signal R/nB indicating that the nonvolatile memories 330 perform a program, erase or read operation, and a data strobe signal DQS which is generated from the read enable signal /RE and is periodically toggled to be used to adjust a sync of the data from the nonvolatile memories 330.

The hybrid device 300 may operate according to a specification of the LRDIMM.

Figure 17:
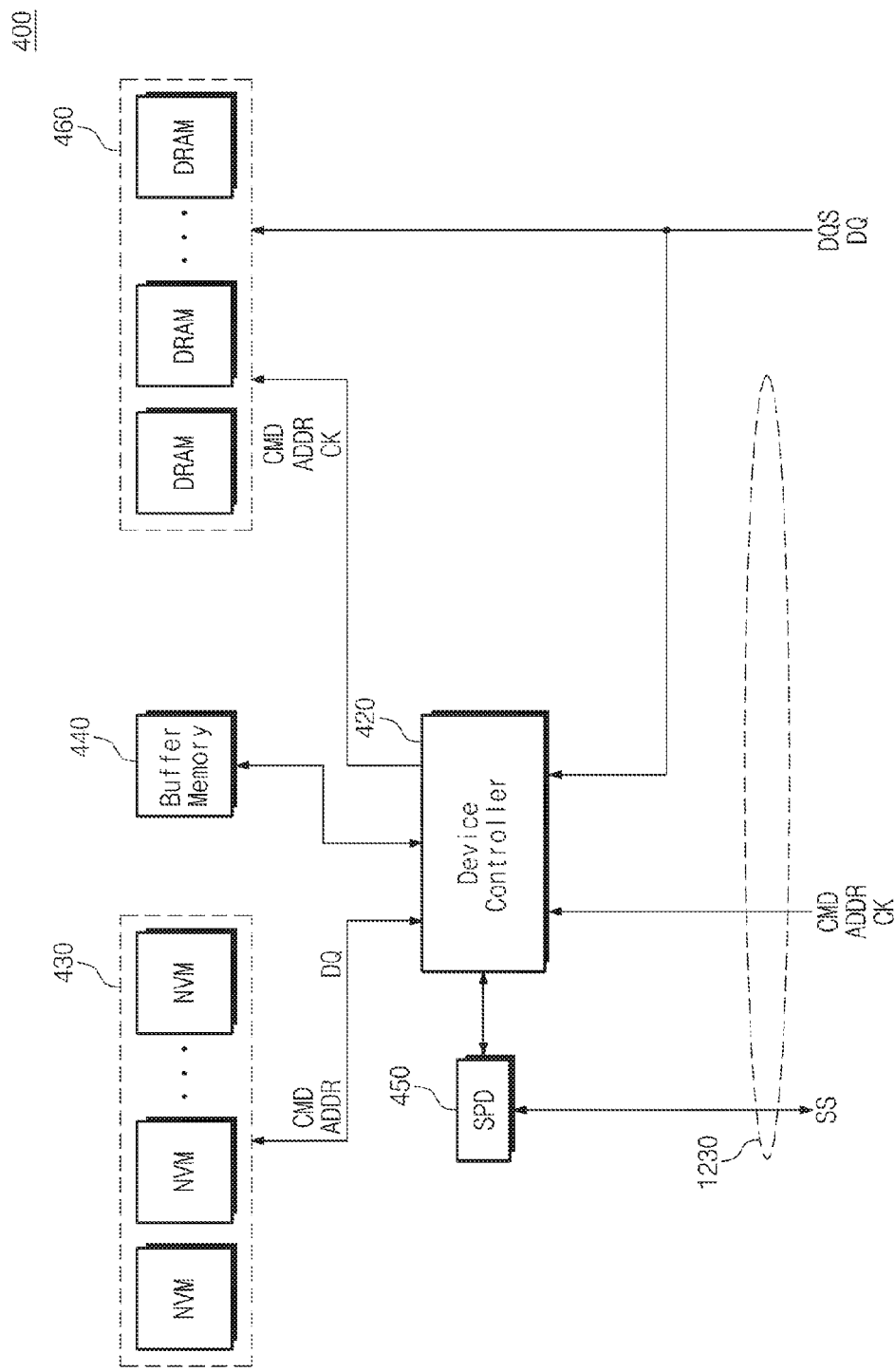
FIG. 17 is a block diagram illustrating a hybrid storage device in accordance with a fourth embodiment of the disclosure.

FIG. 17 is a block diagram illustrating a hybrid storage device 400 in accordance with a fourth embodiment of the disclosure. Referring to FIGS. 1 and 17, the hybrid storage device 400 includes a device controller 420, nonvolatile memories 430, a buffer memory 440, an SPD 450, and random access memories 460. The hybrid storage device 400 can exchange a data signal DQ, a data strobe signal DQS and a supplemental signal SS with the processor 1100 through the high speed interface 1230 and can receive a command CMD, an address ADDR and a clock CK from the processor 1100.

The device controller 420 can distinguish an access target among the nonvolatile memories 430 and the random access memories 460 according to the command CMD, the address ADDR or another signal being received through the high speed interface 1230. When the access target is the nonvolatile memory 430, the device controller 420 can control so that the data signal DQ and the data strobe signal DQS being received through the high speed interface 1230 are received by the device controller 420. When the access target is the random access memories 460, the device controller 420 can control so that the data signal DQ and the data strobe signal DQS being received through the high speed interface 1230 are received by the random access memories 460. For example, the hybrid storage device 400 may further include a switch controlling a path of the data signal DQ and the data strobe signal DQS.

In the case that the access target is the nonvolatile memory 430, the device controller 420 can transmit the command CMD and the address ADDR being received through the high speed interface 1230 to the nonvolatile memories 430. The device controller 420 can transmit the data signal DQ being received through the high speed interface 1230 to the nonvolatile memories 430 and can output the data signal DQ being transmitted from the nonvolatile memories 430 through the high speed interface 1230.

In the case that the access target is the random access memories 460, the device controller 420 can transmit the command CMD, the address ADDR and the clock CK being received through the high speed interface 1230 to the random access memories 460.

The data buffers 310 are not provided in the hybrid storage device 400, as they are in the hybrid storage device 300 of FIG. 16. The data signal DQ and the data strobe signal DQS may be directly transmitted to the device controller 420 or the random access memories 460 through the high speed interface 1230. The high speed interface 1230 may operate according to a specification of the RDIMM. The device controller 420 can communicate with the processor 1100 through the high speed interface 1230 according to the specification of the RDIMM.

Except for an operation according to the specification of the RDIMM, the hybrid storage device 400 may operate as described with reference to FIGS. 3 through 13. The device controller 420 can receive a phase group PG including phase bits PB, as the data signal DQ, through the high speed interface 1230. The device controller 420 can check the validity of the phase bits PB by descrambling the phase bits PB or comparing the phase bits PB with the valid pattern PB_V. In the case that the phase bits PB are valid, the device controller 420 can descramble the phase group PG. The device controller 420 can remove phase bits PB of phase groups PG and dummy bits DMB that belong to a transaction unit and can set a data processing unit DPU using data bits DB.

Figure 18:
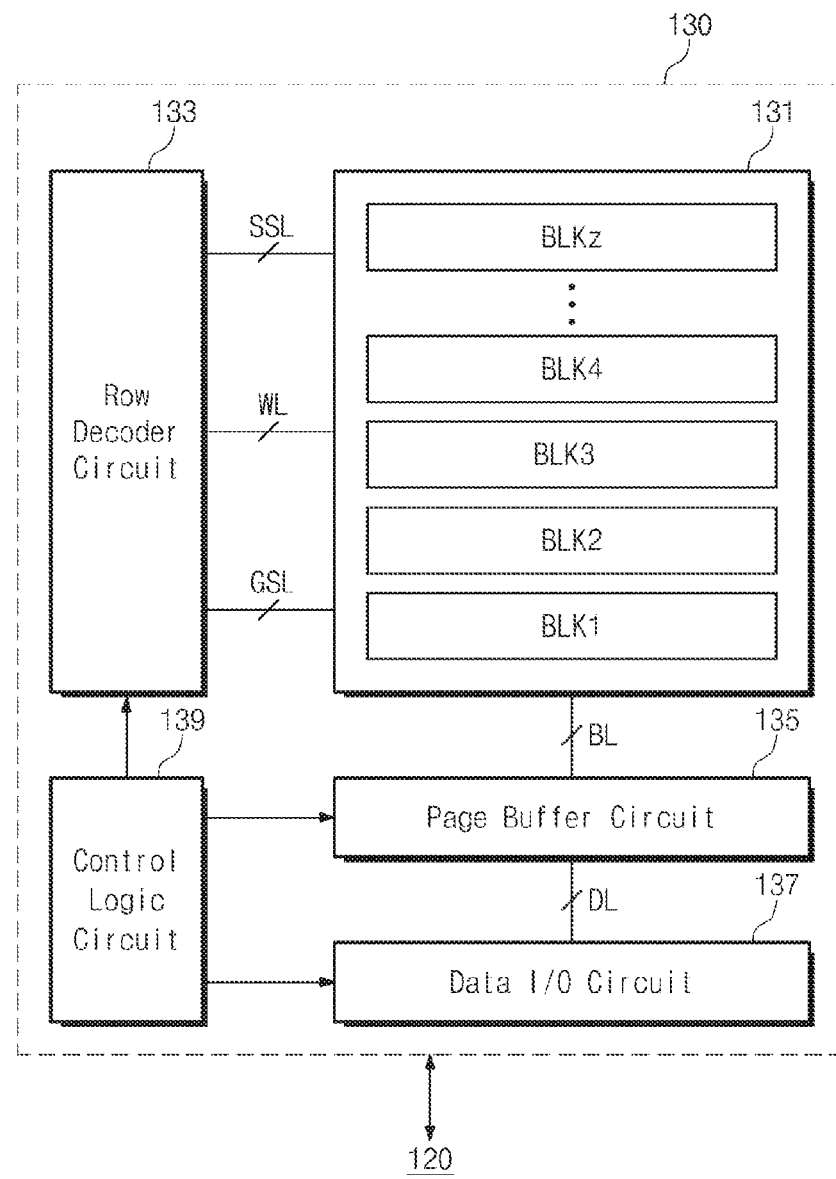
FIG. 18 is a block diagram illustrating one of nonvolatile memories in accordance with exemplary embodiments of the disclosure.

FIG. 18 is a block diagram illustrating one of nonvolatile memories 130 in accordance with exemplary embodiments of the disclosure. Referring to FIGS. 2 and 18, the nonvolatile memory 130 includes a memory cell array 131, a row decoder circuit 133, a page buffer circuit 135, a data input/output (I/O) circuit 137, and a control logic circuit 139.

The memory cell array 131 includes a plurality of memory blocks BLK1~BLKz. Each memory block includes a plurality of memory cells. Each memory block may be connected to the row decoder circuit 133 through at least one ground select line GSL, a plurality of word lines WL and at least one string select line SSL. Each memory block may be connected to the page buffer circuit 135 through a plurality of bit lines BL. The memory blocks BLK1~BLKz may be connected to a plurality of bit lines BL in common Memory cells of the memory blocks BLK1~BLKz may have the same structure. Each of the memory blocks BLK1~BLKz may be an erase-operation unit. Memory cells of the memory cell array 131 may be erased by a memory block unit. Memory cells that belong to one memory block may be erased at the same time. As another example, each memory block may be divided into a plurality of sub blocks. Each sub block may be an erase-operation unit.

The row decoder circuit 133 is connected to the memory cell array 131 through a plurality of ground select lines GSL, a plurality of word lines WL, and a plurality of string select lines SSL. The row decoder circuit 133 operates under the control of the control logic circuit 139. The row decoder circuit 133 can decode an address being received from a controller through an input/output channel and can control voltages being applied to the string select lines SSL, the word lines WL, and the ground select lines GSL according to the decoded address.

For example, in a program operation, the row decoder circuit 133 may apply a program voltage VPGM to a selected word line of a memory block selected by an address and may apply a pass voltage VPASS to unselected word lines of the selected memory block. In a read operation, the row decoder circuit 133 may apply a select read voltage VRD to the selected word line of the memory block selected by the address and may apply an unselect read voltage VREAD to the unselected word lines of the selected memory block. In an erase operation, the row decoder circuit 133 may apply erase voltages (for example, a ground voltage or low voltages having levels similar to the ground voltage) to word lines of the memory block selected by the address.

The page buffer circuit 135 is connected to the memory cell array 131 through a plurality of bit lines BL. The page buffer circuit 135 is connected to the data input/output circuit 137 through a plurality of data lines DL. The page buffer circuit 135 operates under the control of the control logic circuit 139.

In a program operation, the page buffer circuit 135 can store data to be programmed in memory cells. The page buffer circuit 135 can apply voltages to the bit lines BL based on the stored data. For example, the page buffer circuit 135 can function as a write driver. In a read operation, the page buffer circuit 135 can sense voltages of the bit lines BL and can store a sensing result. For example, the page buffer circuit 135 can function as a sense amplifier.

The data input/output circuit 137 is connected to the page buffer circuit 135 through the data lines DL. The data input/output circuit 137 can output data read by the page buffer circuit 135 to the controller 120 through the input/output channel and can transfer data being received from the controller 120 through the input/output channel to the page buffer circuit 135.

The control logic circuit 139 can receive a command from the controller 120 through the input/output channel and can receive a control signal from the controller 120 through a control channel. The control logic circuit 139 can receive a command being received through the input/output channel in response to the control signal, can route an address being received through the input/output channel to the row decoder circuit 133, and can route an address being received through the input/output channel to the data input/output circuit 137. The control logic circuit 139 decodes the received command and can control the nonvolatile memory device 130 according to the decoded command.

In a read operation, the control logic circuit 139 can generate a data strobe signal DQS from a read enable signal (/RE) being received from the controller 120 through the control channel. The generated data strobe signal DQS may be output to the controller 120 through the control channel. In a write operation, the control logic circuit 139 can receive the data strobe signal DQS from the controller 120 through the control channel.

Figure 19:
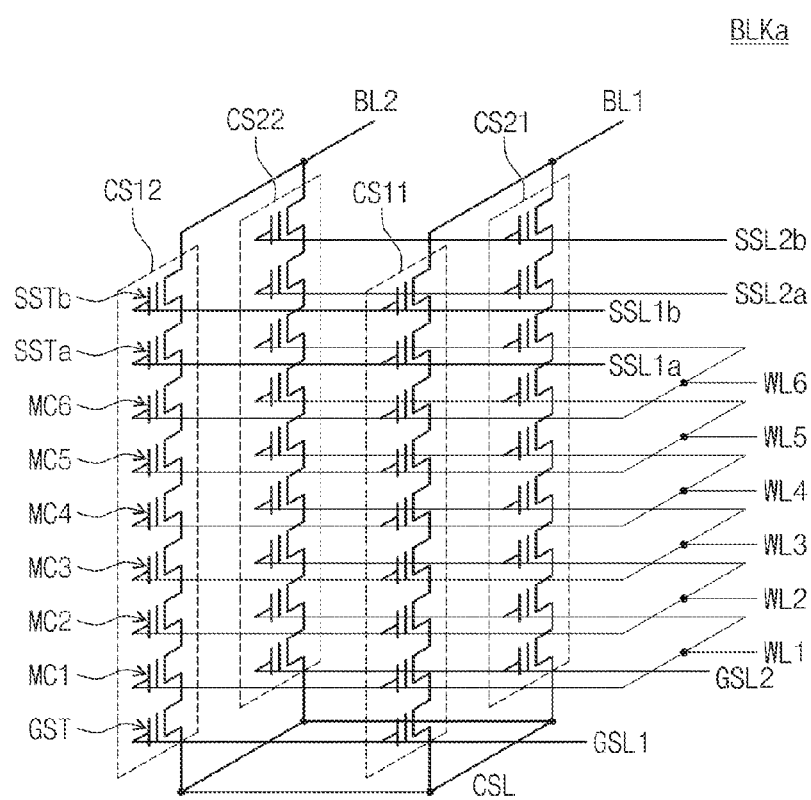
FIG. 19 is a circuit diagram illustrating a memory block in accordance with exemplary embodiments of the disclosure.
Figure 19:
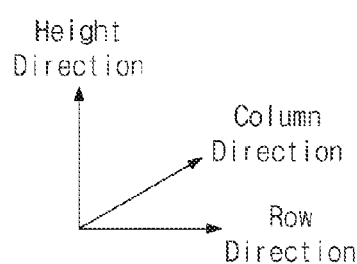

FIG. 19 is a circuit diagram illustrating a memory block BLKa in accordance with exemplary embodiments of the disclosure. Referring to FIG. 19, the memory block BLKa includes a plurality of cell strings (CS11~CS21, CS12~CS22). The cell strings (CS11~CS21, CS12~CS22) may be arranged along a row direction and a column direction to form rows and columns.

For example, the cell strings CS11 and CS12 arranged along the row direction may form a first row and the cell strings CS21 and CS22 arranged along the row direction may form a second row. The cell strings CS11 and CS21 arranged along the column direction may form a first column and the cell strings CS12 and CS22 arranged along the column direction may form a second column.

Each cell string may include a plurality of cell transistors. The cell transistors include ground select transistors GST, memory cells MC1~MC6, and string select transistors SSTa and SSTb. The ground select transistor GST, the memory cells MC1~MC6 and string select transistors SSTa and SSTb of each cell string may be laminated in a height direction perpendicular to a plane (e.g., a plane on a substrate of the memory block BLKa) on which the cell strings (CS11~CS21, CS12~CS22) are arranged along rows and columns.

The cell transistors may be charge trap type transistors having threshold voltages that may vary depending on the amounts of charges trapped in an insulating layer.

Sources of the lowermost ground select transistors GST may be connected to a common source line CSL in common.

Control gates of the ground select transistors GST of the cell strings (CS11~CS12, CS21~CS22) may be connected to ground select lines GSL1 and GSL2 respectively. Ground select transistors of the same row may be connected to the same ground select line and ground select transistors of different rows may be connected to different ground select lines. For example, ground select transistors GST of the cell strings CS11 and CS12 of a first row may be connected to a first ground select line GSL1 and ground select transistors GST of the cell strings CS21 and CS22 of a second row may be connected to a second ground select line GSL2.

Control gates of memory cells located at the same height (or order) from a substrate (or ground select transistors GST) may be connected to one word line in common, and control gates of memory cells located at different heights (or orders) from the substrate (or ground select transistors GST) may be connected to different word lines WL1~WL6 respectively. For example, the memory cells MC1 are connected to the word line WL1 in common. The memory cells MC2 are connected to the word line WL2 in common. The memory cells MC3 are connected to the word line WL3 in common. The memory cells MC4 are connected to the word line WL4 in common. The memory cells MC5 are connected to the word line WL5 in common. The memory cells MC6 are connected to the word line WL6 in common.

At first string select transistors SSTa of the same height (or order) of the cell strings (CS11~CS21, CS12~CS22), control gates of the first string select transistors SSTa of different rows are connected to different string select lines SSL1a~SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At second string select transistors SSTb of the same height (or order) of the cell strings (CS11~CS21, CS12~CS22), control gates of the second string select transistors SSTb of different rows are connected to different string select lines SSL1b~SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or orders) of cell strings of the same row are connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings (CS11~CS21, CS12~CS22) are connected to different bit lines BL1 and BL2 respectively. For example, the string select transistors SSTb of the cell strings CS11~CS21 of the first column are connected to the bit line BL1 in common. The string select transistors SSTb of the cell strings CS12~CS22 of the second column are connected to the bit line BL2 in common.

The cell strings CS11 and CS12 may form a first plane. The cell strings CS21 and CS22 may form a second plane.

In a memory block BLKa, memory cells of each height of each plane may form a physical page. The physical page may be a write unit and a read unit of the memory cells MC1~MC6. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected. In the selected plane, one row of the memory cells MC may be selected by the word lines WL1~WL6. In the selected row, a select voltage may be applied to the second word line WL2 and an unselect voltage may be applied to the remaining word lines WL1 and WL3~WL6. That is, a physical page corresponding to the second word line WL2 of the second plane may be selected by controlling voltages of the string select lines SSL1a, SSL1b, SSL2a and SSL2b and the word lines WL1~WL6. In the memory cells MC2 of the selected physical page, a write or read operation may be performed.

In the memory block BLKa, an erase of the memory cells MC1~MC6 may be performed by a memory block unit or a sub block unit. When an erase operation is performed by a memory block unit, all the memory cells MC of the memory block BLKa may be erased at the same time according to an erase request (e.g., an erase request from an external memory controller). When an erase operation is performed by a sub block unit, a part of the memory cells MC1~MC6 of the memory block BLKa may be erased at the same time according to an erase request and the remaining part of the memory cells MC1~MC6 may be erase-prohibited. A low voltage (for example, a ground voltage or a voltage having a level similar to the ground voltage) may be supplied to a word line connected to the memory cells MC being erased and a word line connected to the erase-prohibited memory cells MC may be floated.

The memory block BLKa illustrated in FIG. 19 is illustrative. A technical spirit of the disclosure is not limited to the memory block BLKa illustrated in FIG. 19. For example, the number of rows of the cell strings may increase or decrease. As the number of rows of the cell strings changes, the number of string select lines or ground select lines that are connected to rows of the cell strings, and the number of cell strings connected to one bit line may also be changed.

The number of columns of the cell strings may increase or decrease. As the number of columns of the cell strings changes, the number of bit lines connected to columns of the cell strings, and the number of cell strings connected to one string select line may also be changed.

A height of the cell strings may increase or decrease. For example, the number of ground select transistors, memory cells or string select transistors that are laminated on each of the cell strings may increase or decrease.

Memory cells MC that belong to one physical page may correspond to at least three logical pages. For example, k (k is a positive integer greater than 2) number of bits may be programmed in one memory cell MC. In the memory cells MC that belong to one physical page, k number of bits being programmed in each memory cell MC may form k number of logical pages respectively.

In an embodiment of the present disclosure, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to the embodiments of the disclosure, data stored in the internal RAM is selectively processed depending on whether phase bits are valid. Thus, processing invalid data is prevented and a storage device having an improved speed is provided.

Although a few embodiments of the disclosure have been described, those skilled in the art will readily appreciate that many modifications are possible in the embodiments without materially departing from the novel teachings and advantages of the present invention. Accordingly, all such modifications are intended to be included within the scope of the present invention as defined in the claims. The present invention is defined by the following claims, with equivalents of the claims to be included therein.

What is claimed is:

1. A storage device comprising:
   nonvolatile memories; and
   a device controller that: (1) stores data received from an external device in an internal random access memory (RAM) according to a command and an address received from the external device, (2) controls the nonvolatile memories according to the data stored in the internal RAM, (3) determines whether phase bits, which are received with the data and stored in the internal RAM, are valid, and (4) processes the data stored in the internal RAM in response to determining that the phase bits are valid.

2. The storage device of claim 1, wherein the device controller processes data of a phase group to which valid phase bits belong, when phase bits that belong to the phase group are stored in the internal RAM.

3. The storage device of claim 2, wherein a size of the phase group is smaller than a size of each transmission transaction in which the external device transmits the data to the storage device.

4. The storage device of claim 3, wherein the device controller sets data processing units based on valid data bits, which are stored in the internal RAM, other than the phase bits.

5. The storage device of claim 4, wherein:
   the device controller processes the data stored in the internal RAM by a unit of the phase group before the data processing units are set and processes the data according to each data processing unit after the data processing units are set, and
   a number of data processing units generated from each transaction is smaller than a number of phase groups of each transaction.

6. The storage device of claim 1, wherein the device controller descrambles the phase bits and determines whether the descrambled phase bits are valid.

7. The storage device of claim 1, wherein the device controller descrambles the data stored in the internal RAM when the phase bits are valid.

8. The storage device of claim 1, wherein the device controller determines whether the phase bits are valid by comparing the phase bits with a valid pattern of a scramble table.

9. The storage device of claim 8, wherein:
   the device controller stores the address and other data received from the external device in the scramble table in an initialization operation, and
   the device controller selects the valid pattern from the scramble table according to the address being received from the external device after the initialization operation.

10. The storage device of claim 1, wherein the device controller comprises:
    a selector that: (1) selects the phase bits stored in the internal RAM to output the selected phase bits when a control signal is in an inactivation state and (2) selects the data stored in the internal RAM to output the selected data when the control signal is in an activation state;
    a descramble circuit that descrambles the selected phase bits or the selected data output from the selector;
    a demultiplexer that outputs the descrambled phase bits when the control signal is in the inactivation state and outputs the descrambled data when the control signal is in the activation state; and
    a discriminator that receives the descrambled phase bits from the demultiplexer and activates the control signal when the descrambled phase bits are valid.

11. The storage device of claim 1, wherein the device controller comprises:
    a selector that: (1) selects the phase bits stored in the internal RAM to output them when a control signal is in an inactivation state and (2) selects the data stored in the internal RAM to output it when the control signal is in an activation state;
    a descramble circuit that descrambles the selected data output from the selector; and
    a discriminator that compares the selected phase bits output from the selector with a valid pattern and activates the control signal when the phase bits are identical to the valid pattern.

12. The storage device of claim 1, wherein the device controller detects another command and another address, with respect to the nonvolatile memories, from the data stored in the internal RAM.

13. The storage device of claim 12, wherein when the other command is a write command, the device controller detects particular data within the data stored in the internal RAM and writes the particular data in the nonvolatile memories according to the other command.

14. The storage device of claim 12, wherein when the other command is a read command, the device controller reads particular data from the nonvolatile memories and stores the particular data in the internal RAM.

15. A storage device comprising:
    nonvolatile memories; and
    a device controller that: (1) stores data received from an external device in an internal random access memory (RAM) according to a command and an address received from the external device, (2) controls the nonvolatile memories according to the data stored in the internal RAM, (3) descrambles phase bits that are received with the data and stored in the internal RAM, and (4) descrambles the data stored in the internal RAM when the descrambled phase bits have a valid pattern.

16. A data storage device comprising:
    a random access memory (RAM); and
    a device controller that stores a write unit received from a host in the RAM, the write unit comprising validation information and encoded data bits, and determines whether the validation information represents expected information, wherein:

the device controller decodes the encoded data bits of the write unit in response to determining that the validation information represents the expected information and does not decode the encoded data bits in response to determining that the validation information does not to represent the expected information.

17. The data storage device of claim 16, wherein:

a different portion of the write unit is received from the host in each of multiple write operations; and the device controller does not make the determination as to whether the validation information represents the expected information until determining that an entirety of the write unit is received from the host.

18. The data storage device of claim 17, wherein the validation information is distributed among multiple portions of the write unit.

19. The data storage device of claim 16, wherein the data bits are encoded with information identifying a memory address within the RAM where the write unit is stored.

20. The data storage device of claim 16, wherein the device controller determines whether the validation information represents the expected information based upon information identifying a memory address within the RAM where the write unit is stored.

\* \* \* \* \*